(12) United States Patent
Kim et al.

(10) Patent No.: US 9,390,778 B2
(45) Date of Patent: Jul. 12, 2016

(54) SEMICONDUCTOR MEMORY DEVICES AND MEMORY SYSTEMS INCLUDING THE SAME

(71) Applicant: SAMSUNG ELECTRONICS CO., LTD., Suwon-Si, Gyeonggi-Do (KR)

(72) Inventors: Su-A Kim, Seongnam-si (KR); Dae-Sun Kim, Hwaseong-si (KR); Dae-Jeong Kim, Seoul (KR); Sung-Min Ryu, Gimhae-si (KR); Kwang-Il Park, Yongin-si (KR); Chul-Woo Park, Yongin-si (KR); Young-Soo Sohn, Seoul (KR); Jae-Youn Youn, Seoul (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/798,164

(22) Filed: Jul. 13, 2015

(65) Prior Publication Data
US 2016/0064056 A1  Mar. 3, 2016

(30) Foreign Application Priority Data
Aug. 26, 2014  (KR) .................. 10-2014-0111310

(51) Int. Cl.
| G11C 8/12 | (2006.01) |
| G11C 8/08 | (2006.01) |
| G11C 7/02 | (2006.01) |
| G11C 7/18 | (2006.01) |
| G11C 7/10 | (2006.01) |

(52) U.S. Cl.
CPC .. *G11C 8/08* (2013.01); *G11C 7/02* (2013.01); *G11C 7/1006* (2013.01); *G11C 7/18* (2013.01); *G11C 8/12* (2013.01)

(58) Field of Classification Search
CPC .......... G11C 8/12; G11C 7/18; G11C 7/1006
USPC .................................................. 365/230.03
See application file for complete search history.

(56) References Cited

U.S. PATENT DOCUMENTS

| 5,410,508 | A | 4/1995 | McLaury |
| 5,636,175 | A | 6/1997 | McLaury |
| 5,650,976 | A | 7/1997 | McLaury |
| 5,666,321 | A * | 9/1997 | Schaefer ............. G11C 7/1018  365/230.03 |
| 6,646,949 | B1 | 11/2003 | Ellis et al. |
| 7,345,946 | B1 | 3/2008 | Chapman et al. |
| 2011/0286262 | A1 | 11/2011 | Kitayama |

FOREIGN PATENT DOCUMENTS

| KR | 1019990062231 | 7/1999 |
| KR | 1020090002803 | 1/2009 |

* cited by examiner

*Primary Examiner* — Jason Lappas
(74) *Attorney, Agent, or Firm* — F. Chau & Associates, LLC

(57) ABSTRACT

A semiconductor memory device includes a memory cell array, sub word-line drivers and power selection switches. The memory cell array includes memory cell rows coupled to word lines. The sub word line drivers are coupled to the word lines. The power selection switches are coupled to the sub word-line drivers. Each power selection switch controls a deactivation voltage level of a first word-line activated from the word-lines and an off-voltage level of a second word line adjacent to the first word line so that the deactivation voltage level and the off-voltage level have at least one of a ground voltage, a first negative voltage and a second negative voltage. The ground voltage, the first negative voltage and the second negative voltage have different voltage levels from each other.

20 Claims, 21 Drawing Sheets

SEMICONDUCTOR MEMORY DEVICES AND MEMORY SYSTEMS INCLUDING THE SAME

CROSS-REFERENCE TO RELATED APPLICATION

This application claims priority under 35 U.S.C. §119 to Korean Patent Application No. 10-2014-0111310, filed on Aug. 26, 2014 in the Korean Intellectual Property Office, the disclosure of which is incorporated by reference herein in its entirety.

TECHNICAL FIELD

The present inventive concept relates to semiconductor memory devices and memory systems including the same.

DISCUSSION OF RELATED ART

A high voltage is applied to a word line of a semiconductor memory device, such as a dynamic random access memory (DRAM), to enable a transistor to access a memory cell. However, high electric field generated from such high voltage may cause disturbance to an access transistor of an adjacent cell.

Such disturbance becomes more significant when distance of two adjacent cells decreases due to reduction of a chip size.

SUMMARY

According to an exemplary embodiment of the present inventive concept, a semiconductor memory device includes a memory cell array, sub word-line drivers and power selection switches. The memory cell array includes memory cell rows coupled to word lines. The sub word line drivers are coupled to the word lines. The power selection switches are coupled to the sub word-line drivers. Each power selection switch controls a deactivation voltage level of a first word-line activated from the word-lines and an off-voltage level of a second word line adjacent to the first word line so that the deactivation voltage level and the off-voltage level have at least one of a ground voltage, a first negative voltage and a second negative voltage. The off-voltage level of the second word-line after deactivation of the first word-line is controlled to have different voltage level from the off-voltage level of the second word-line during the first word-line activated. The ground voltage, the first negative voltage and the second negative voltage have different voltage levels from each other.

According to an exemplary embodiment of the present inventive concept, a memory system includes a memory controller and the semiconductor memory device.

According to an exemplary embodiment of the present inventive concept, a method of operating a semiconductor memory device is provided. A first word line is driven at a first voltage level during an activation period of the first word line. A second word line and the second word line are driven, during the activation period, at a second voltage level which is higher than the first voltage level. The second word line is adjacent to the first word line, and the third word line, adjacent to the second word line, is spaced apart from the first word line. A first deactivation operation, upon completion of the activation period, is performed on the first word line for a first deactivation period of the first word line. The first word line is driven from the first voltage level to a third voltage level which is between the first voltage level and the second voltage level. A second deactivation operation, upon completion of the first deactivation period, is performed on the first word line. The first word line is driven from the third voltage level to the second voltage level

BRIEF DESCRIPTION OF THE DRAWINGS

These and other features of the inventive concept will become more apparent by describing in detail exemplary embodiments thereof with reference to the accompanying drawings of which.

DETAILED DESCRIPTION OF THE EMBODIMENTS

Figure 1:
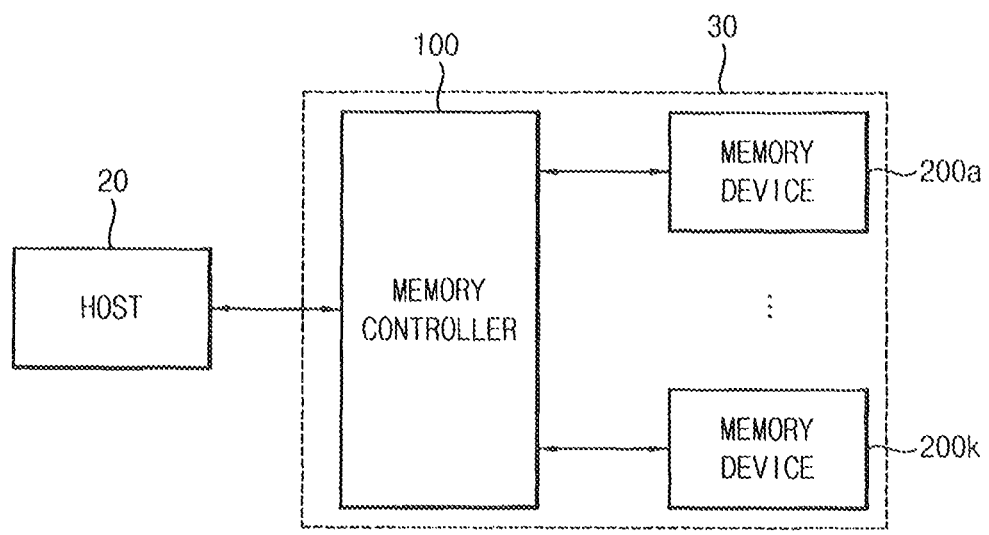
FIG. 1 is a block diagram illustrating an electronic system according to an exemplary embodiment of the present inventive concept.

Exemplary embodiments of the inventive concept will be described below in detail with reference to the accompanying drawings. However, the inventive concept may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings. For the convenience of description, "n-channel" may be interchangeably used with "N-type", and "word-line" may be interchangeably used with "word line".

FIG. 1 is a block diagram illustrating an electronic system according to an exemplary embodiment of the present inventive concept.

Referring to FIG. 1, an electronic system 10 includes a host 20 and a memory system 30. The memory system 30 includes a memory controller 100 and a plurality of semiconductor memory devices 200a~200k.

The host 20 communicates with the memory system 30 through various interface protocols such as Peripheral Component Interconnect-Express (PCI-E), Advanced Technology Attachment (ATA), Serial ATA (SATA), Parallel ATA (PATA), or serial attached SCSI (SAS). In addition, the host 20 may also communicate with the memory system 30 through interface protocols such as Universal Serial Bus (USB), Multi-Media Card (MMC), Enhanced Small Disk Interface (ESDI), or Integrated Drive Electronics (IDE).

The memory controller 100 controls an overall operation of the memory system 30. The memory controller 100 controls an overall data exchange between the host 20 and the plurality of semiconductor memory devices 200a~200k. For example, the memory controller 100 writes data to the plurality of semiconductor memory devices 200a~200k or read data from the plurality of semiconductor memory devices 200a~200k in response to request from the host 20.

In addition, the memory controller 100 issues operation commands to the plurality of semiconductor memory devices 200a~200k for controlling the plurality of semiconductor memory devices 200a~200k.

Each of the plurality of semiconductor memory devices 200a~200k may be a dynamic random access memory (DRAM), such as a double data rate synchronous dynamic random access memory (DDR SDRAM), a low power double data rate synchronous dynamic random access memory (LPDDR SDRAM), a graphics double data rate synchronous dynamic random access memory (GDDR SDRAM), a Rambus dynamic random access memory (RDRAM), etc.

Figure 2:
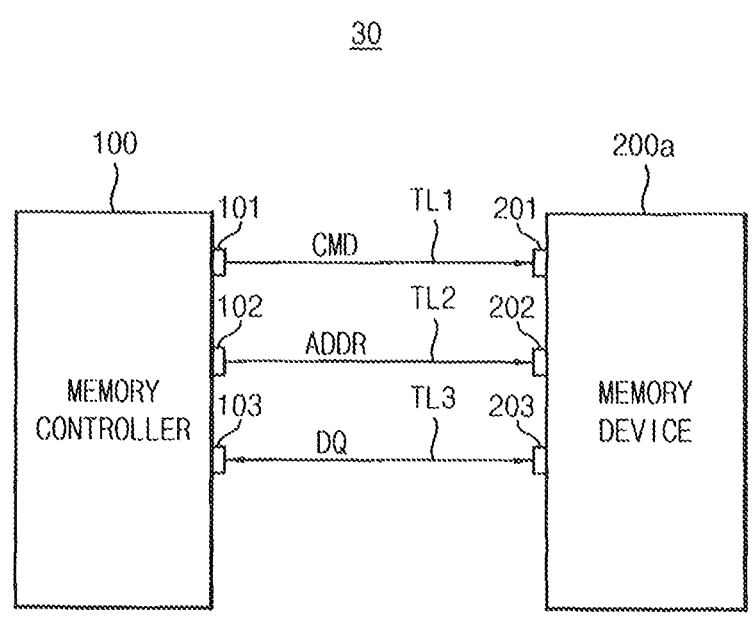
FIG. 2 is a block diagram illustrating a memory system of FIG. 1 according to an exemplary embodiment of the present inventive concept.

FIG. 2 is a block diagram illustrating a memory system of FIG. 1 according to an exemplary embodiment of the present inventive concept.

For the convenience of description, the memory controller 100 communicates only one semiconductor memory device 200a. However, the memory controller 100 may communicate with the other semiconductor memory devices 200b~200k as described below with reference to the semiconductor memory device 200a.

Referring to FIG. 2, the memory system 30 includes the memory controller 100 and the semiconductor memory device 200a. Each of the memory controller 100 and the semiconductor memory device 200a may be formed as a separate semiconductor chip or as a separate group of chips (e.g., semiconductor memory device 200a may a stack of semiconductor chips in a semiconductor package). The memory controller 100 and the semiconductor memory device 200a are connected to each other through corresponding command pins 101 and 201, corresponding address pins 102 and 202, and corresponding data pins 103 and 203. The command pins 101 and 201 may transmit a command signal CMD through a command transmission line TL1, the address pins 102 and 202 may transmit an address signal ADDR through an address transmission line TL2, and the data pins 103 and 203 may exchange data block DTA through a data transmission line TL3.

Referring to FIGS. 1 and 2, the memory controller 100 may send data to the semiconductor memory device 200a or may receive data from the semiconductor memory device 200a through the data pins 103 and 203 based on the request from the host 20. In addition, the semiconductor memory device 200a may receive address from the memory controller 100 through the address pins 102 and 202.

Figure 3:
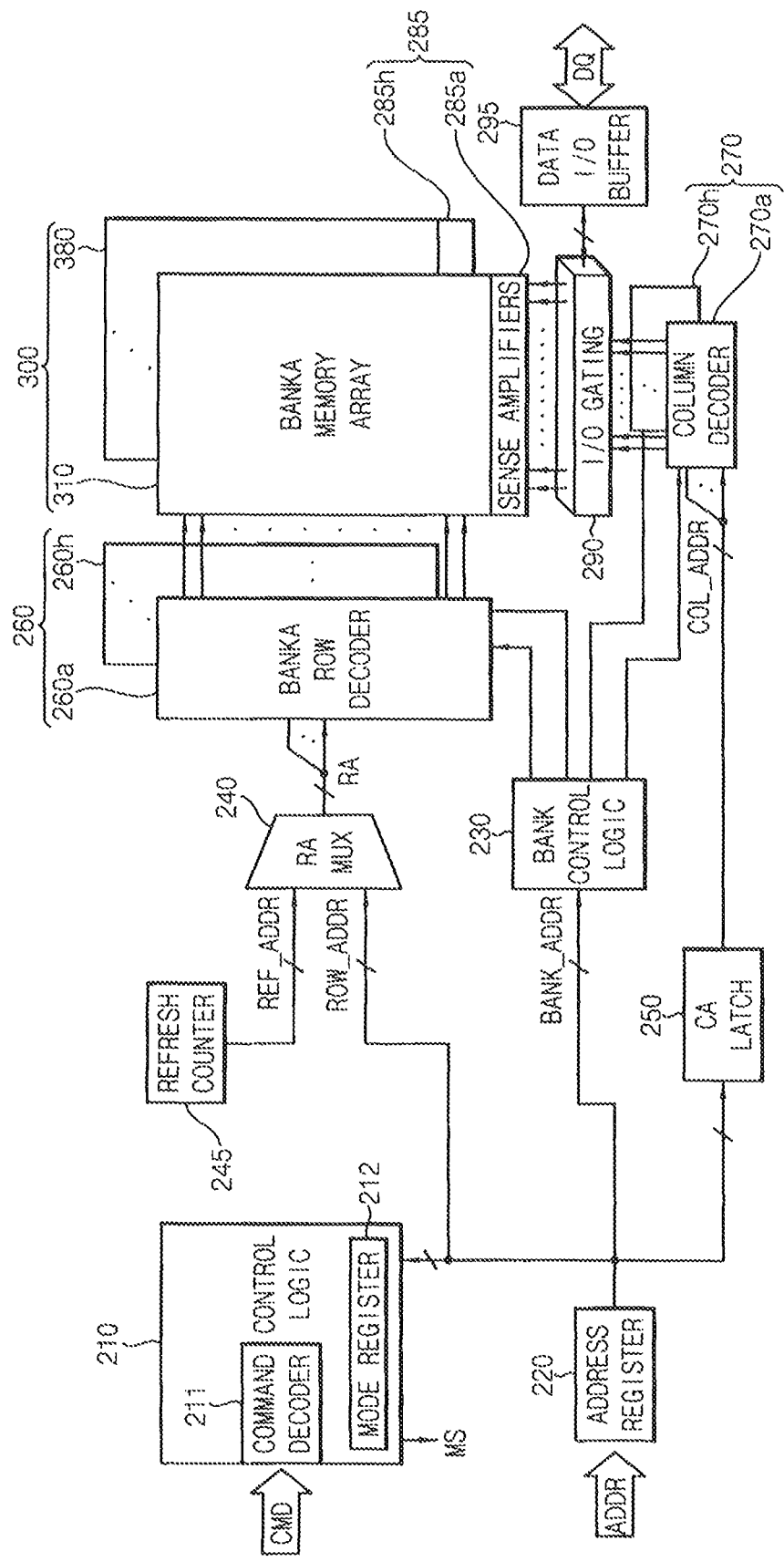
FIG. 3 is a block diagram illustrating a semiconductor memory device of FIG. 2 according to an exemplary embodiment of the present inventive concept.

FIG. 3 is a block diagram illustrating a semiconductor memory device of FIG. 2 according to an exemplary embodiment of the present inventive concept.

Referring to FIG. 3, the semiconductor memory device 200a includes a control logic 210, an address register 220, a bank control logic 230, a row address multiplexer 240, a column address latch 250, a row decoder 260, a column decoder 270, a memory cell array 300, a sense amplifier unit 285, an input/output (I/O) gating circuit 290, a data input/output (I/O) buffer 295, and a refresh counter 245.

The memory cell array 300 includes first through eighth bank arrays 310~380. The row decoder 260 includes first through eighth bank row decoders 260a~260h respectively coupled to the first through eighth bank arrays 310~380, the column decoder 270 includes first through eighth bank column decoders 270a~270h respectively coupled to the first through eighth bank arrays 310~380, and the sense amplifier unit 285 includes first through eighth bank sense amplifiers 285a~285h respectively coupled to the first through eighth bank arrays 310~380. The first through eighth bank arrays 310~380, the first through eighth bank row decoders 260a~260h, the first through eighth bank column decoders 270a~270h and first through eighth bank sense amplifiers 285a~285h form first through eighth banks. For the convenience of description, the semiconductor memory device 200a includes eight banks, but the present inventive concept is not limited thereto. The semiconductor memory device 200a may include any number of banks.

The address register 220 receives an address ADDR including a bank address BANK_ADDR, a row address ROW_ADDR and a column address COL_ADDR from the memory controller 100. The address register 220 provides the received bank address BANK_ADDR to the bank control logic 230, provides the received row address ROW_ADDR to the row address multiplexer 240, and provides the received column address COL_ADDR to the column address latch 250.

The bank control logic 230 generates bank control signals in response to the bank address BANK_ADDR. One of the first through eighth bank row decoders 260a~260h corresponding to the bank address BANK_ADDR is activated in response to the bank control signals, and one of the first through eighth bank column decoders 270a~270h corresponding to the bank address BANK_ADDR is activated in response to the bank control signals.

The row address multiplexer 240 receives the row address ROW_ADDR from the address register 220, and receives a refresh row address REF_ADDR from the refresh counter 245. The row address multiplexer 240 selectively outputs one of the row address ROW_ADDR and the refresh row address REF_ADDR as a row address RA. The row address RA is applied to the first through eighth bank row decoders 260a~260h.

The activated one of the first through eighth bank row decoders 260a~260h decodes the row address RA that is output from the row address multiplexer 240, and a word-line corresponding to the row address RA is activated. For example, the activated bank row decoder may apply a word-line driving voltage to the word-line corresponding to the row address RA.

The column address latch 250 receives the column address COL_ADDR from the address register 220, and temporarily stores the received column address COL_ADDR. In a burst mode operation, the column address latch 250 may generate column addresses using the received column address COL_ADDR. For example, the generated column address may increase starting from the received column address COL_ADDR. The column address latch 250 may apply the temporarily stored and/or generated column address to the first through eighth bank column decoders 270a~270h.

The activated one of the first through eighth bank column decoders 270a~270h decodes the column address COL_ADDR that is output from the column address latch 250, and controls the input/output gating circuit 290 to output data corresponding to the column address COL_ADDR.

The I/O gating circuit 290 may include a circuitry for gating input/output data. The I/O gating circuit 290 may further include read data latches for storing data that is output from the first through eighth bank arrays 310~380, and write drivers for writing data to the first through eighth bank arrays 310~380.

Data DQ to be read from one bank array of the first through eighth bank arrays 310~380 are sensed by a sense amplifier 285 coupled to the one bank array from which the data is to be read, and are stored in the read data latches. The data DQ stored in the read data latches are provided to the memory controller 100 via the data I/O buffer 295. Data DQ to be written in one bank array of the first through eighth bank arrays 310~380 are provided to the data I/O buffer 295 from the memory controller 100. The write driver writes the data DQ to one bank array of the first through eighth bank arrays 310~380.

The control logic 210 controls operations of the semiconductor memory device 200a. For example, the control logic 210 generates control signals to operate the semiconductor memory device 200a in a write operation or a read operation. The control logic 210 includes a command decoder 211 that decodes a command CMD received from the memory controller 100 and a mode register 212 that sets an operation mode of the semiconductor memory device 200a. The control logic 210 generates a mode signal MS based on the decoded command CMD.

For example, the command decoder 211 generates the control signals corresponding to the command CMD by decoding a write enable signal (/WE), a row address strobe signal (/RAS), a column address strobe signal (/CAS), a chip select signal (/CS), etc.

Figure 4:
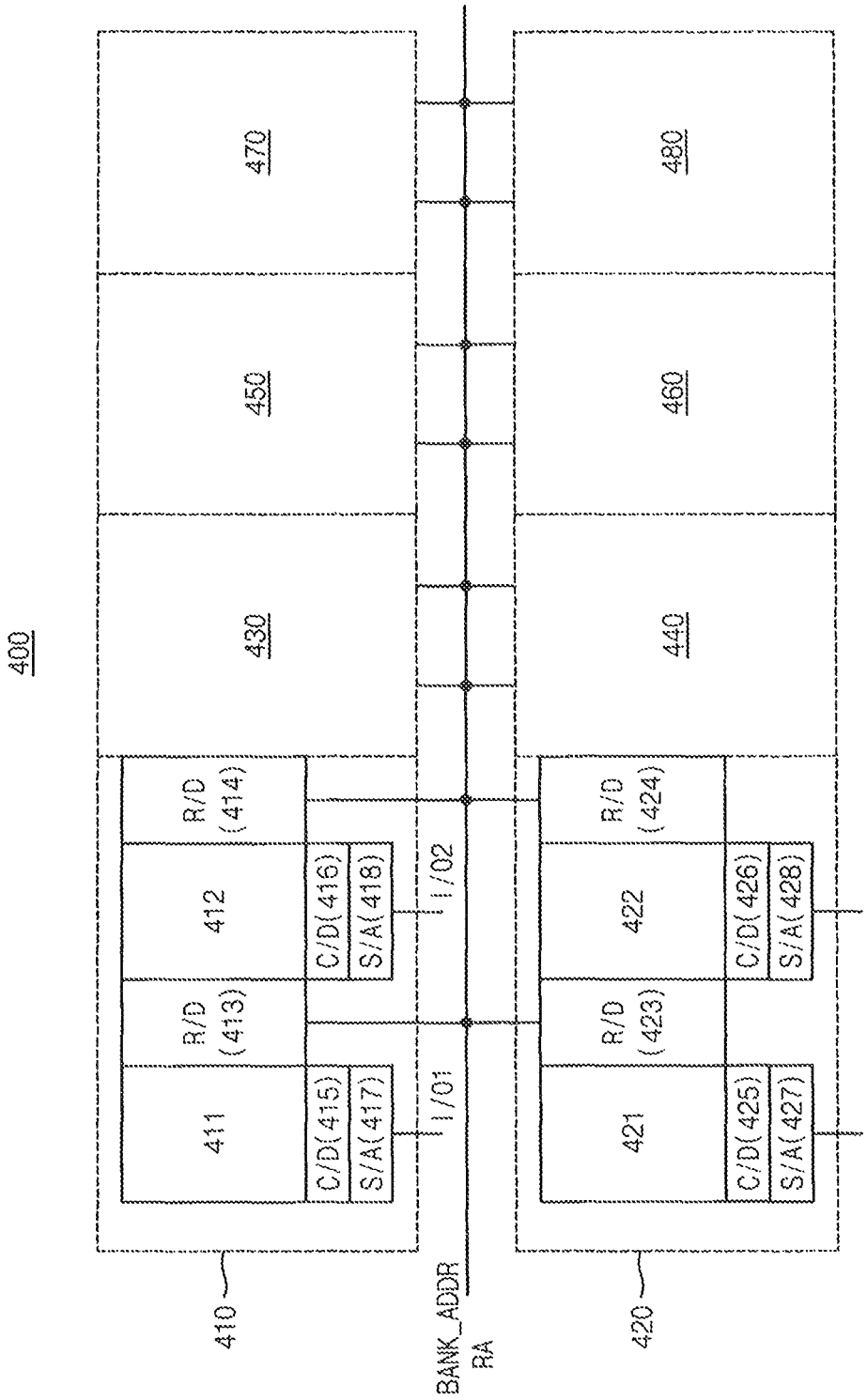
FIG. 4 is a block diagram illustrating a semiconductor memory device of FIG. 3 according to an exemplary embodiment of the present inventive concept.
Figure 5:
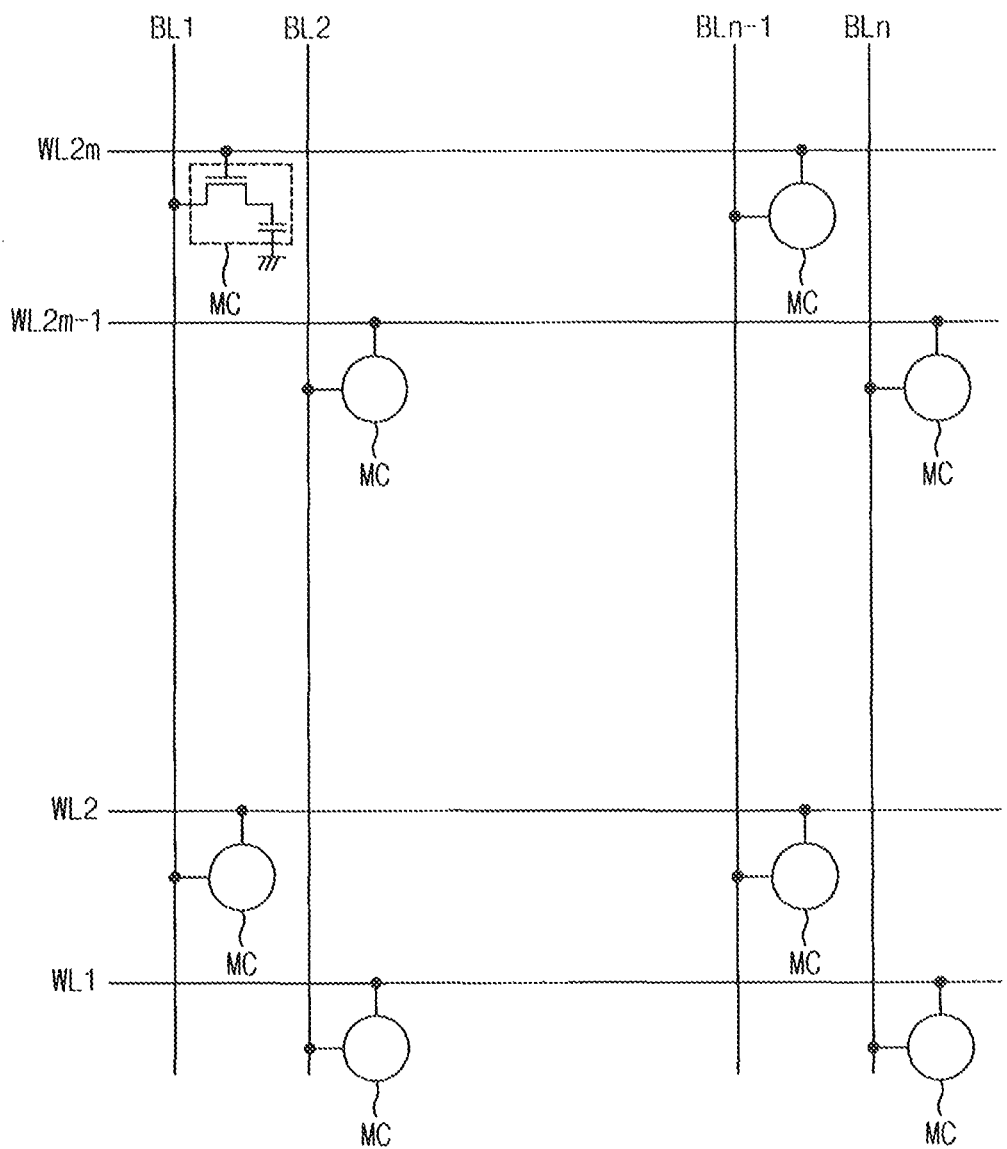
FIG. 5 is a circuit diagram illustrating one of bank arrays of FIG. 3 according to an exemplary embodiment of the present inventive concept.

FIG. 4 is a block diagram illustrating a semiconductor memory device of FIG. 3 according to an exemplary embodiment of the present inventive concept. FIG. 5 is a circuit diagram illustrating one of bank arrays of FIG. 3 according to an exemplary embodiment of the present inventive concept.

Referring to FIGS. 4 and 5, a semiconductor memory device 400 includes a plurality of banks 410~480 in which a plurality of memory cells are arranged in columns and rows. Each of the plurality of banks 410~480 includes a plurality of word-lines WL1~WL2m (m is a natural number greater than two), a plurality of bit-lines BL1~BLn (n is a natural number greater than two), and a plurality of memory cells MCs disposed near intersections between the word-lines WL1~WL2m and the bit-lines BL1~BLn. For example, each of the plurality of memory cells MCs may include a dynamic random access memory (DRAM) cell structure. The plurality of word-lines WL1~WL2m to which the plurality of memory cells MCs are connected may be referred to as rows of the plurality of banks 410~480, and the plurality of bit-lines BL1~BLn to which the plurality of memory cells MCs are connected may be referred to as columns of each of the plurality of banks 410~480.

For the convenience of description, the semiconductor memory device 400 includes eight banks 410~480 in FIG. 4. However, the present inventive concept is not limited thereto, and the number of banks included in the semiconductor memory device 400 may be any positive integer.

The first bank 410 of the plurality of banks 410~480 includes a first sub-bank 411, a second sub-bank 412, a first row decoder 413, a second row decoder 414, a first column decoder 415, and a second column decoder 416. In addition, the second bank 420 includes a first sub-bank 421, a second sub-bank 422, a first row decoder 423, a second row decoder 424, a first column decoder 425, and a second column decoder 426. Each configuration of third through eighth banks 430~480 may be substantially the same as each configuration of the first bank 410 and the second bank 420. The first row decoder 413 and the second row decoder 414 receive the bank address BANK_ADDR and the row address RA. The first column decoder 415 and the second column decoder 416 receive the column addresses. One of the plurality of banks 410~480 is selected in response to the bank address BANK_ADDR, and memory cells in the selected bank are accessed in response to the row address RA and the column address.

The first bank 410 is divided into the first sub-bank 411 and the second sub-bank 412. The first sub-bank 411 and the second sub-bank 412 are arranged in a row direction, in which the plurality of word-lines WL1~WL2m of the plurality of memory cells MCs are extended. The first sub-bank 411 is connected to the first row decoder 413 and the first column decoder 415. Memory cells of the first sub-bank 411 are addressed by the first row decoder 413 and the first column decoder 415. The second sub-bank 412 is connected to the second row decoder 414 and the second column decoder 416. Memory cells of the second sub-bank 412 are addressed by the second row decoder 414 and the second column decoder 416.

At least one of the first sub-bank 411 and the second sub-bank 412 may be selected by any one bit from among the row address signals RA applied to the first row decoder 413 and the second row decoder 414. For example, the first sub-bank 411 or the second sub-bank 412 may be selected by the most significant bit (MSB) of the row address signals RA.

The first sub-bank 411 and the second sub-bank 412 are respectively connected to first and second data line sense amplifier blocks 417 and 418, and are also respectively connected to first and second data input/output lines I/O1 and I/O2 which are independent from each other. Data that is read from the first sub-bank 411 may be output through the first data line sense amplifier block 417 and the first data input/output lines I/O1. Data that is read from the second sub-bank 412 may be output through the second data line sense amplifier 418 and the second data input/output lines I/O2.

Figure 6:
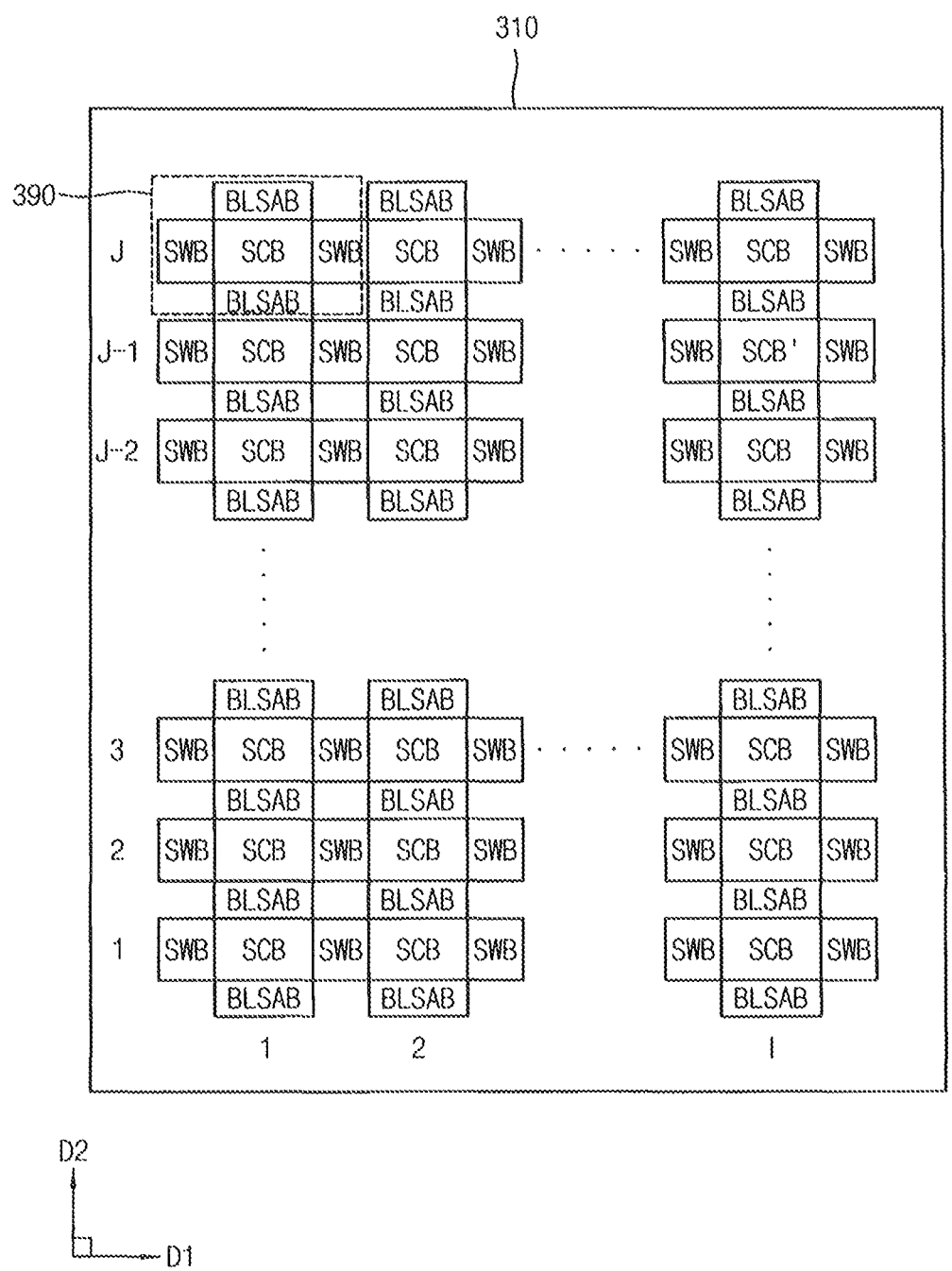
FIG. 6 is a diagram illustrating an architecture of one bank array of a semiconductor memory device of FIG. 3 according to an exemplary embodiment of the present inventive concept.

FIG. 6 is a diagram illustrating an architecture of one bank array of a semiconductor memory device of FIG. 3 according to an exemplary embodiment of the present inventive concept.

Referring to FIG. 6, in the first bank array 310, I sub array blocks SCB are disposed in a first direction D1, and J sub array blocks SCB are disposed in a second direction D2 crossing the first direction D1. I and J represent the number of sub array blocks. A plurality of bit-lines, a plurality of word-lines, and a plurality of memory cells may be disposed in each of the sub array blocks SCB. The plurality of memory cells may be disposed at intersections between the bit-lines and the word-lines.

I+1 sub word-line driver regions SWB are disposed between the sub array blocks SCB in the first direction D1. Sub word-line drivers are disposed in the sub word-line driver regions SWB.

J+1 bit-line sense amplifier regions BLSAB are disposed between the sub array blocks SCB in the second direction D2. Bit-line sense amplifiers to sense data stored in the memory cells are disposed in the bit-line sense amplifier regions BLSAB.

Figure 7:
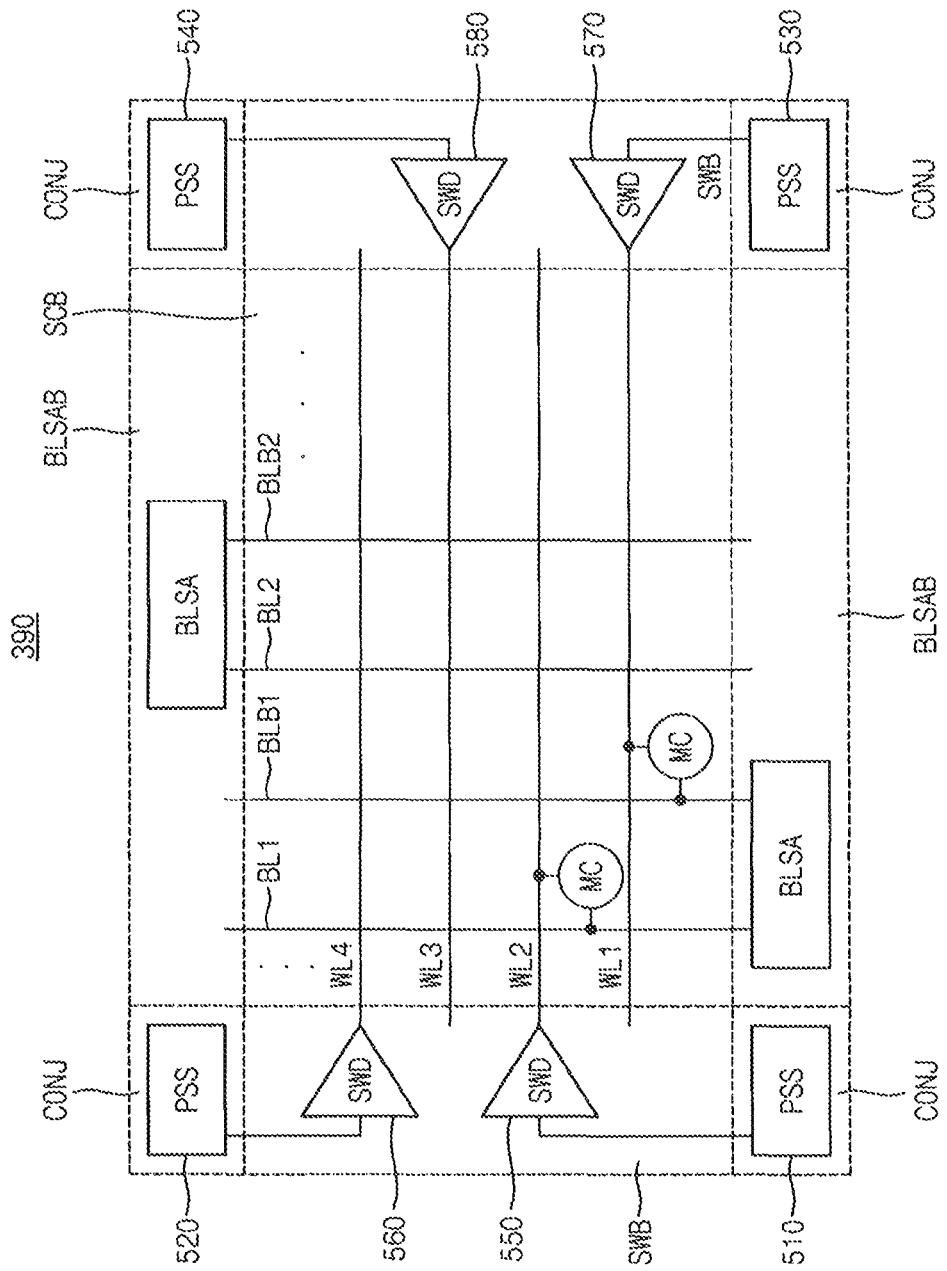
FIG. 7 is a diagram illustrating a sub array of FIG. 6 according to an exemplary embodiment of the present inventive concept.

FIG. 7 is a diagram illustrating a sub array of FIG. 6 according to an exemplary embodiment of the present inventive concept.

Referring to FIGS. 6 and 7, portion 390 of the first bank array 310 includes the sub array block SCB, the bit-line sense amplifier regions BLSAB, the sub word-line driver regions SWB and conjunction regions CONJ.

The sub array block SCB includes a plurality of word-lines WL1~WL4 extending in a row direction and a plurality of bit-line pairs BL1~BL2 and BLB1~BLB2 extending in a column direction. The sub array block SCB includes a plurality of memory cells MCs disposed at intersections between the word-lines WL1~WL4 and the bit-line pairs BL1~BL2 and BLB1~BLB2.

The sub word-line driver regions SWB include a plurality of sub word-line drivers 550, 560, 570 and 580 that drive the word-lines WL1~WL4 respectively. The sub word-line drivers 550 and 560 are disposed in the sub word-line driver region SWB which is left with respect to the sub array block SCB and the sub word-line drivers 570 and 580 are disposed in the sub word-line driver region SWB which is right with respect to the sub array block SCB.

The bit-line sense amplifier regions BLSAB include bit-line sense amplifiers BLSA coupled to the bit-line pairs BL1~BL2 and BLB1~BLB2. The bit-line sense amplifiers BLSA sense and amplify a voltage difference between the bit-line pair BL and BLB to provide the amplified voltage difference to a local input/output line pair. The bit-line sense amplifiers BLSA are alternately disposed at upper portion and a lower portion of the sub array block SCB.

The conjunction regions CONJ are disposed adjacent to the bit-line sense amplifier regions BLSAB, the sub word-line driver regions SWB and the sub array bloc SCB. A plurality of power selection switches 510, 520, 530 and 540 are disposed in the conjunction regions CONJ.

The power selection switch 510 is coupled to the sub word-line driver 550 that drives the word-line WL2, the power selection switch 520 is coupled to the sub word-line driver 560 that drives the word-line WL4, the power selection switch 530 is coupled to the sub word-line driver 570 that drives the word-line WL1 and the power selection switch 540 is coupled to the sub word-line driver 580 that drives the word-line WL3.

Figure 8:
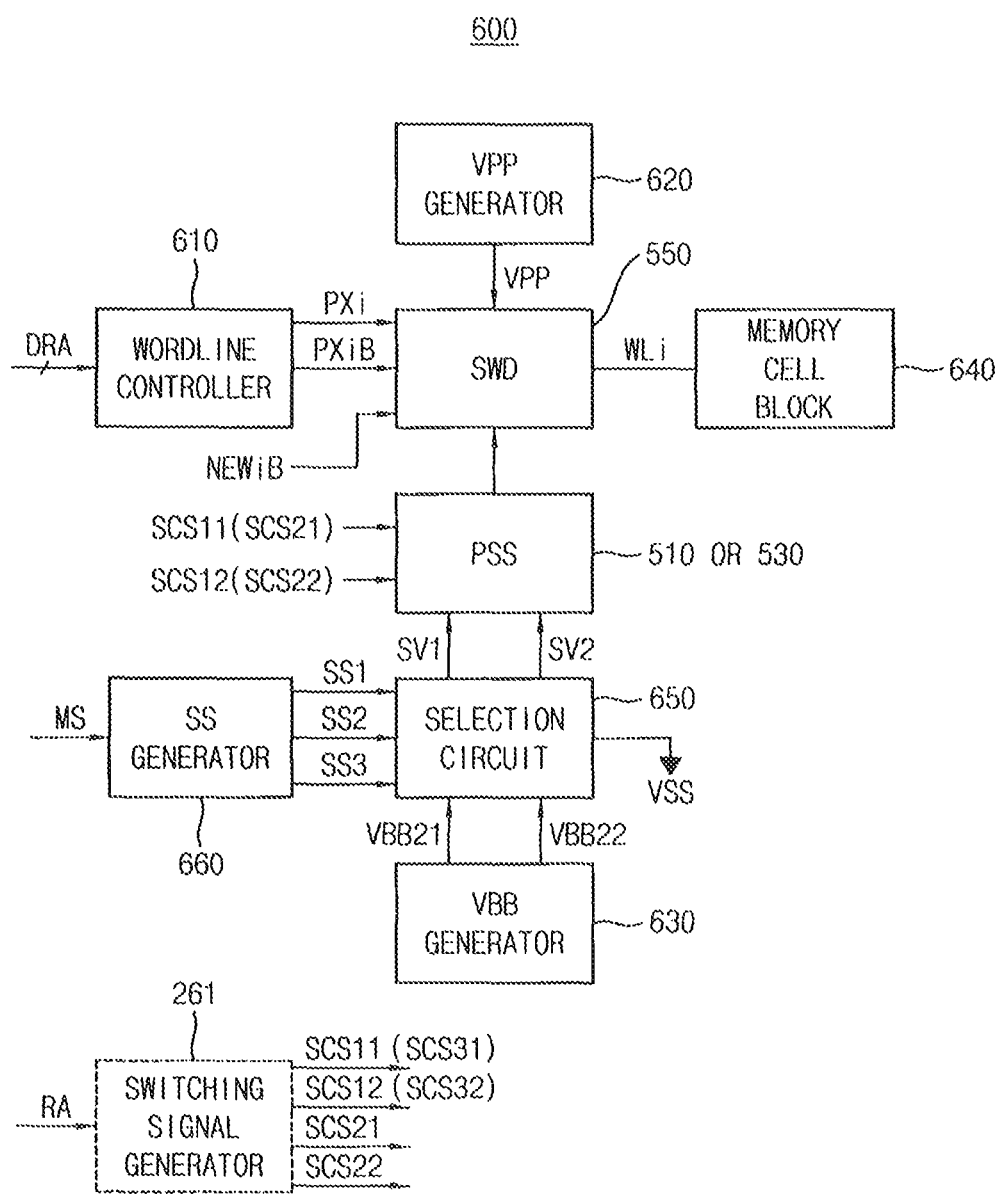
FIG. 8 is a block diagram illustrating a semiconductor memory device according to an exemplary embodiment of the present inventive concept.

FIG. 8 is a block diagram illustrating a semiconductor memory device according to an exemplary embodiment of the present inventive concept.

Referring to FIG. 8, a semiconductor memory device 600 includes a word-line controller 610, at least one memory cell block 640, a boosted voltage generator 620, a negative voltage generator 630, a sub word-line driver 550, a power selection switch 510, a selection circuit 650 and a selection signal generator 660. In FIG. 8, a switching signal generator 261 included in the row decoder 260a is also illustrated for the convenience of description.

The memory cell block 640 includes a plurality of memory cells coupled to a plurality of word-lines WLi, and each of the memory cells stores data. The boosted voltage generator 620 generates a boosted voltage VPP to the sub word-line driver 550. The negative voltage generator 630 generates a first negative voltage VBB21 and a second negative voltage VBB22 having different levels to the selection circuit 650. The selection circuit 650 includes a multiplexer and selects two voltages of the first negative voltage VBB21, the second negative voltage VBB22 and a ground voltage VSS as a first selection voltage SV1 and a second selection voltage SV2, in response to first through third selection signals SS1, SS2 and SS3 and provides the power selection switch 510 with the first and second selection voltages SV1 and SV2.

The power selection switch 510 provides the sub word-line driver 550 with the first and second selection voltages SV1 and SV2 in response to the switching control signals SCS11 and SCS12 or SCS21 and SCS22. The selection signal generator 660 outputs first through third selection signals SS1, SS2 and SS3 to the selection circuit 650 in response to a mode signal MS. The switching signal generator 261 generates switching control signals SCS11 (or SCS31), SCS12 (or SCS32), SCS21 and SCS22 based on the row address RA for accessing a memory cell row coupled to a selected word-line.

The word-line controller 610 may generate first and second word-line enable control signals PXi and PXiB for controlling the sub word-line driver 550 in response to a decoded row address signal DRA.

The number of the sub word-line drivers 550 in the semiconductor memory device 600 is same as the number of the word-lines WLi included in the memory cell block 640.

Figure 9:
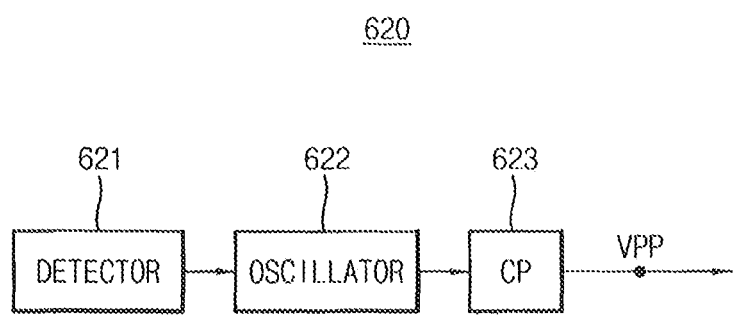
FIG. 9 is a block diagram illustrating a boosted voltage generator of FIG. 8 according to an exemplary embodiment of the present inventive concept.

FIG. 9 is a block diagram illustrating a boosted voltage generator of FIG. 8 according to an exemplary embodiment of the present inventive concept.

Referring to FIG. 9, the boosted voltage generator 620 of FIG. 8 includes a detector 621, an oscillator 622 and a charge pump 623.

The detector 621 detects a voltage level for generating the boosted voltage VPP. The oscillator 22 operates in response to the detected voltage level by the detector 622 and generates pulse signals in complementary relationship with the detected voltage level. The charge pump 623 performs pumping operation in response to the pulse signals to generate the boosted voltage VPP.

Figure 10:
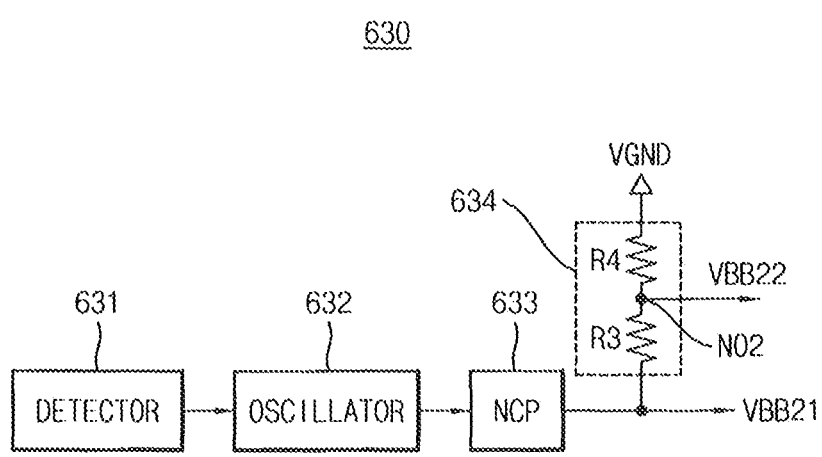
FIG. 10 is a block diagram illustrating a negative voltage generator of FIG. 8 according to an exemplary embodiment of the present inventive concept.

FIG. 10 is a block diagram illustrating a negative voltage generator of FIG. 8 according to an exemplary embodiment of the present inventive concept.

Referring to FIG. 10, the negative voltage generator 630 of FIG. 8 includes a detector 631, an oscillator 632, a negative charge pump 633 and a voltage divider 634.

The detector 631 detects a voltage level for generating the first and second negative voltages VBB21 and VBB22. The oscillator 632 operates in response to the detected voltage level by the detector 632 and generates pulse signals in complementary relationship with the detected voltage level. The negative charge pump 633 performs pumping operation in response to the pulse signals to generate the first negative voltage VBB21. The voltage divider 234 includes third and fourth resistors R3 and R4 connected in series at an output node NO2 between an output of the negative charge pump 633 and a ground voltage VGND, and the voltage divider 634 voltage-divides the first negative voltage VBB21 to provide the second negative voltage VBB22 at the output node NO2.

Figure 11:
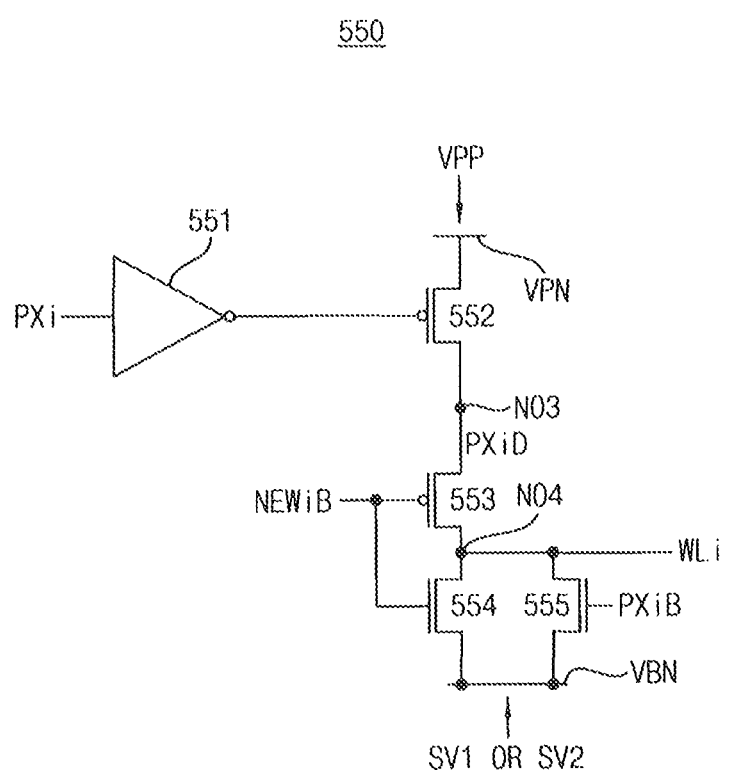
FIG. 11 is a circuit diagram illustrating a sub word-line driver of FIG. 8 according to an exemplary embodiment of the present inventive concept.

FIG. 11 is a circuit diagram illustrating a sub word-line driver of FIG. 8 according to an exemplary embodiment of the present inventive concept.

Referring to FIG. 11, the sub word-line driver 550 of FIG. 8 includes an inverter 551, P-type metal oxide semiconductor (PMOS) transistors 552 and 553, and N-type metal oxide semiconductor (NMOS) transistors 554 and 555. The PMOS transistor 552 has a source connected to a boosted voltage terminal VPN, a gate receiving an output of the inverter 551 and a drain connected to a boosted node NO3. The PMOS transistor 553 has a source connected to the boosted node NO3, a gate receiving a word-line enable signal NEWiB and a drain connected to an enable node NO4. The NMOS transistor 554 has a drain connected to the enable node NO4, gate receiving the word-line enable signal NEWiB and a source connected to a negative voltage terminal VBN. The NMOS transistor 555 has a drain connected to the enable node NO4, gate receiving the second word-line enable control signal PXiB and a source connected to the negative voltage terminal VBN. The boosted voltage VPP is applied to the boosted voltage terminal VPN and one of the first and second selection voltages SV1 and SV2 is applied to the negative voltage terminal VBN.

The PMOS transistor 552 receives the boosted voltage VPP, and transfers the boosted voltage to the boost node NO3 in response to the first word-line enable control signal PXi. The PMOS transistor 553 receives the boosted voltage from the PMOS transistor 552 through a source and enables a corresponding word line WLi connected to the enable node NO4 with the boosted voltage in response to the word-line enable signal NEWiB. The NMOS transistor 554 and the NMOS transistor 555 each receives a ground voltage through a source terminal. The NMOS transistor 554 transfers the negative voltage to the enable node NO4 in response to the word line enable signal NEWiB, and the NMOS transistor 555 disables the corresponding word line WLi connected to the enable node NO4 with the negative voltage in response to the second word-line enable control signal PXiB.

Figure 12:
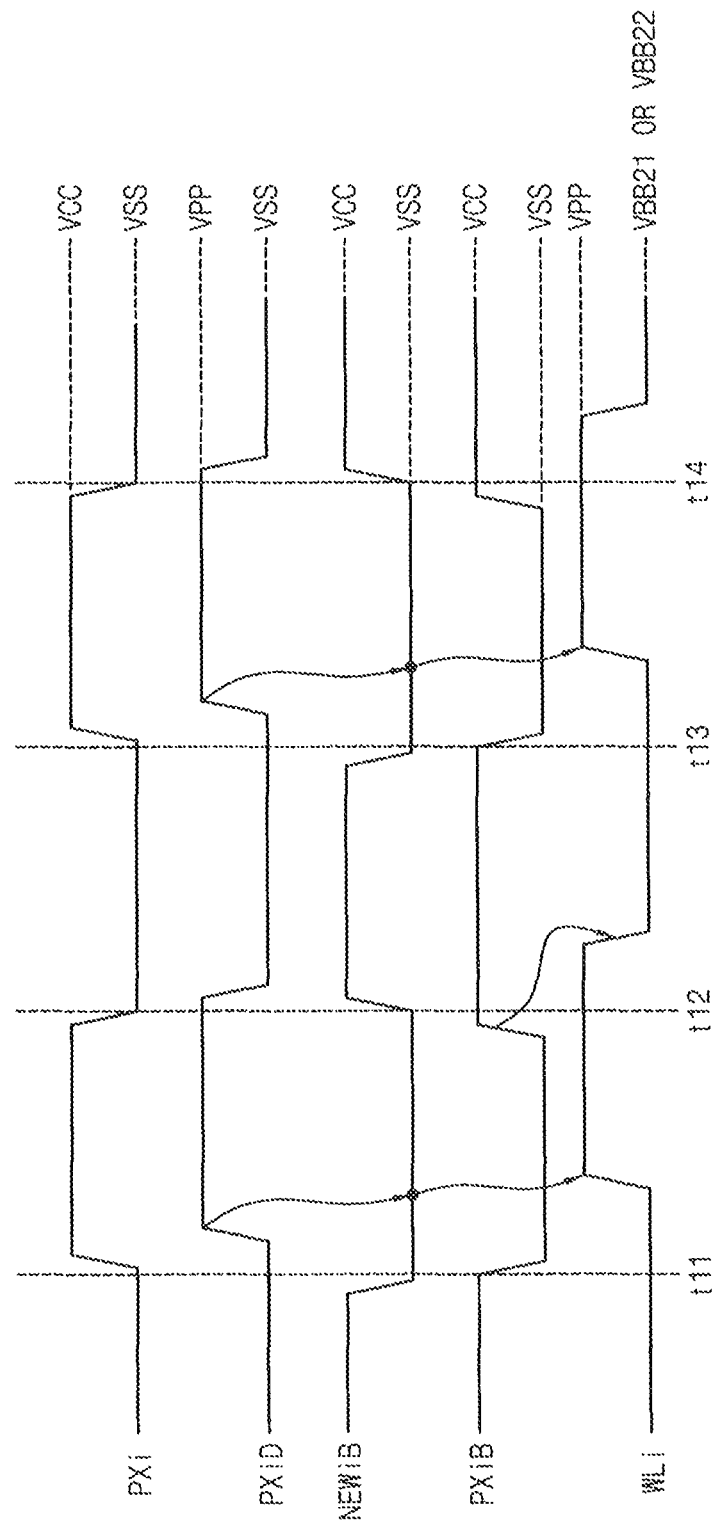
FIG. 12 is a timing diagram for driving a word-line of a semiconductor memory device of FIG. 8 according to an exemplary embodiment of the present inventive concept.

FIG. 12 is a timing diagram for driving a word-line in a semiconductor memory device of FIG. 8 according to an exemplary embodiment of the present inventive concept.

Referring to FIGS. 8 through 12, the first word-line enable control signal PXi transitions from logic low level VSS to logic high level VCC at timings t11 and t13 when the corresponding word-line is to be enabled in response to a row address and transitions from logic high level VCC to logic low level VSS at timings t12 and t14 when other word-lines are enabled.

A boosted node voltage signal PxiD transitions from logic low level VSS to the boosted voltage VPP at timing t11 and t13 after the first word-line enable control signal PXi transitions from logic low level VSS to logic high level VCC, and transitions from the boosted voltage VPP to the ground voltage VSS at timing t12 and t14 after first word-line enable control signal PXi transitions from the logic high level VCC to logic low level VSS. For the row decoder to activate the corresponding word line WLi, the word line enable signal NEWiB transitions from logic high level VCC to logic low level VSS at timings t11 and t13. When other word lines are enabled (or the corresponding word line WLi is deactivated), the word line enable signal NEWiB transitions from logic low level VSS to logic high level VCC at timings t12 and t14.

The second word line enable signal PXiB is complementary with the first word-line enable signal PXi. For example, the word line enable control signal PXiB, if the corresponding word line WLi is enabled, transits from logic high level VCC to low level at timings t11 and t13. When other word-lines are enabled (or when the corresponding word line WLi is deactivated or disabled), the second word line-enable control signal PXiB transitions from logic low level VSS to logic high level VCC at timings t12 and t14.

The corresponding word-line WLi is initially maintained at the negative voltage level in response to the second word-line enable control signal PxiB, and the boost node voltage signal PXiD is delayed for a given time and transferred when the word line enable signal NEWiB transitions to the logic low level at each timing t11 and t13. When other word-lines are activated and the word-line enable bar signal NEWiB transitions to the logic high level at each timing t12 and t14, the corresponding word-line signal WL is disabled to the negative voltage VBB21 or VBB22 level in response to the second word-line enable control signal PXiB.

Figure 13:
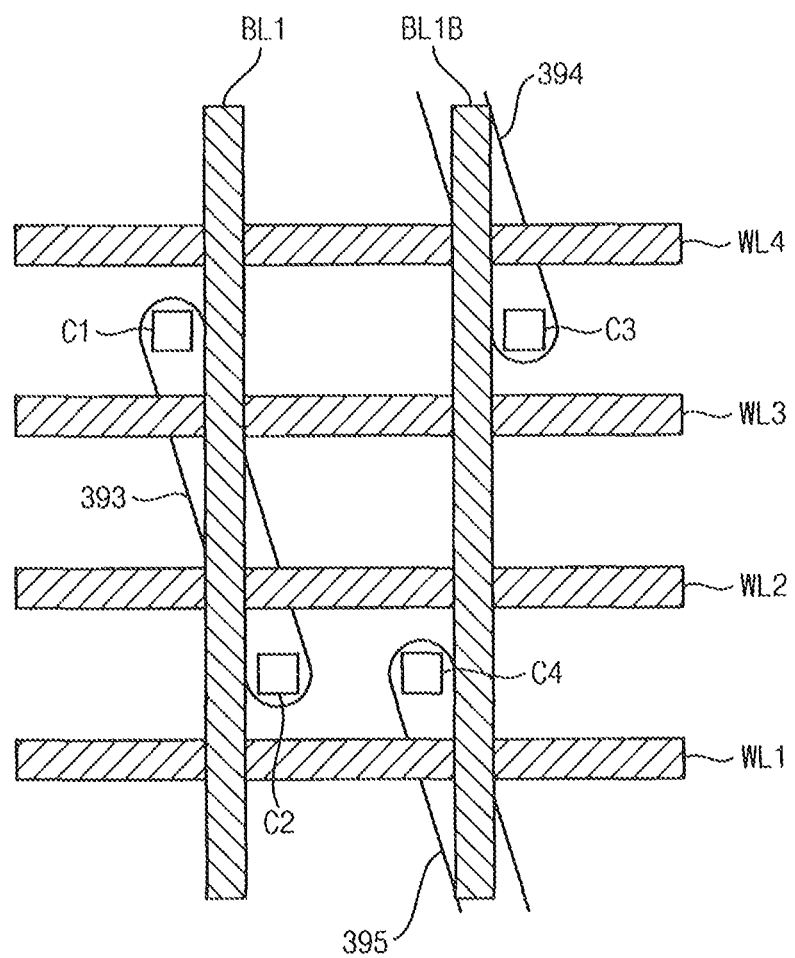
FIG. 13 illustrates a memory cell block of FIG. 8 according to an exemplary embodiment of the present inventive concept.

FIG. 13 illustrates a memory cell block of FIG. 8 according to an exemplary embodiment of the present inventive concept.

Referring to FIG. 13, the memory cell block includes word-lines WL1~WL4, a pair of bit-lines including a bit-line BL1 and a complementary bit-line BL1B and a plurality of active regions 393, 394 and 395. Memory cells C1 and C2 are formed in the active region 393, a memory cell C3 is formed in the active region 394 and a memory cell C4 is formed in the active region 395.

Figure 14:
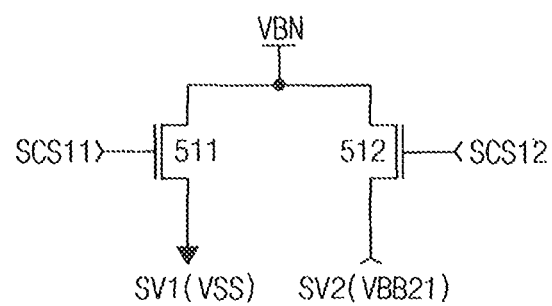
FIG. 14 illustrates a first power selection switch of FIG. 7 according to an exemplary embodiment of the present inventive concept.

FIG. 14 illustrates a first power selection switch of FIG. 7 according to an exemplary embodiment of the present inventive concept.

Referring to FIGS. 7 and 14, the first power selection switch 510 coupled to the sub word-line driver 550 that drives the word-line WL2 includes a first n-channel metal-oxide semiconductor (NMOS) transistor 511 and a second NMOS transistor 512 that are connected in parallel to the negative voltage terminal VBN.

The first NMOS transistor 511 may provides the ground voltage VSS to the negative voltage terminal VBN as the first selection voltage SV1 in response to the switching control signal SCS11. The second NMOS transistor 512 may provides the first negative voltage VBB21 to the negative voltage terminal VBN as the second selection voltage SV2 in response to the switching control signal SCS12.

Figure 15:
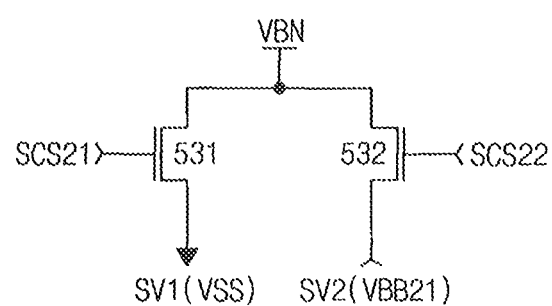
FIG. 15 illustrates a second power selection switch of FIG. 7 according to an exemplary embodiment of the present inventive concept.

FIG. 15 illustrates a second power selection switch of FIG. 7 according to an exemplary embodiment of the present inventive concept.

Referring to FIGS. 7 and 15, the second power selection switch 530 coupled to the sub word-line driver 570 that drives the word-line WL1 includes a first NMOS transistor 531 and a second NMOS transistor 532 that are connected in parallel to the negative voltage terminal VBN.

The first NMOS transistor 531 provides the ground voltage VSS to the negative voltage terminal VBN as the first selection voltage SV1 in response to the switching control signal SCS21. The second NMOS transistor 532 provides the first negative voltage VBB21 to the negative voltage terminal VBN as the second selection voltage SV2 in response to the switching control signal SCS22.

Figure 16:
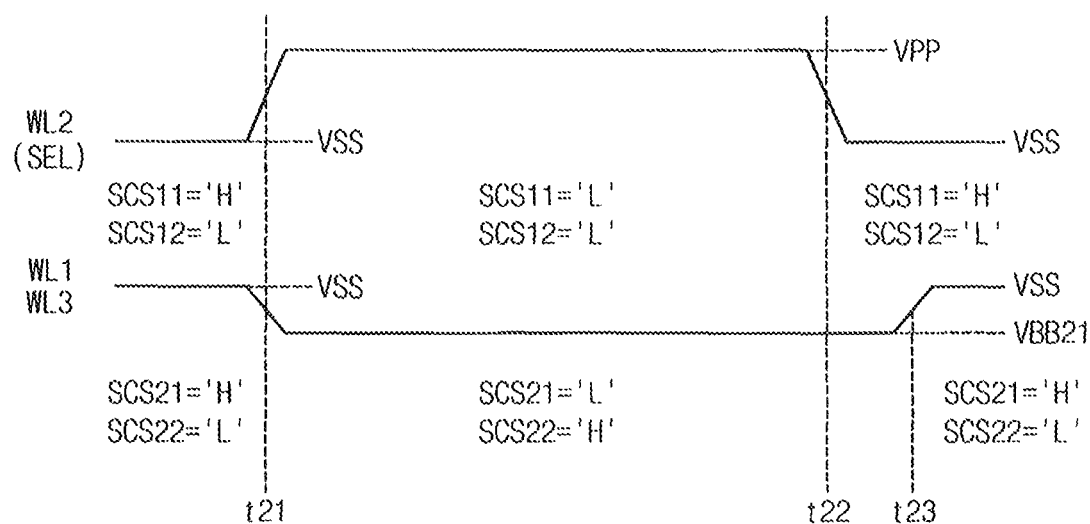
FIG. 16 illustrates a timing diagram for driving word-lines of a memory cell block of FIG. 13 according to an exemplary embodiment of the present inventive concept.

FIG. 16 illustrates a timing diagram for operating word-lines in a memory cell block of FIG. 13 according to an exemplary embodiment of the present inventive concept.

In FIG. 16, it is assumed that the word-line WL2 is selected.

Referring to FIGS. 7 and 13 through 16, before timing t21, the switching control signal SCS11 is logic high level, the switching control signal SCS12 is logic low level, the switching control signal SCS21 is logic high level and the switching control signal SCS22 is logic low level. Therefore, the selected word-line WL2 and adjacent word-lines WL1 and WL3 adjacent to the selected word-line WL2 are precharged to the ground voltage VSS level before timing t21.

During an activation interval between timings t21 and t22, the switching control signal SCS11 is logic low level, the switching control signal SCS12 is logic low level, the switching control signal SCS21 is logic low level and the switching control signal SCS22 is logic high level. Therefore, the selected word-line WL2 is supplied with the boosted voltage VPP and off-voltage level of the adjacent word-lines WL1 and WL3 is supplied with the first negative voltage VBB21.

At timing t22, the selected word-line WL2 is deactivated, and the selected word-line WL2 is discharged to the ground voltage VSS level, and the off-voltage level of the adjacent word-lines WL1 and WL3 is maintained at the first negative voltage level VBB21 until timing t23. After timing t23, the switching control signal SCS11 is logic high level, the switching control signal SCS12 is logic low level, the switching control signal SCS21 is logic high level and the switching control signal SCS22 is logic low level. Therefore, the selected word-line WL2 and the adjacent word-lines WL1 and WL3 are discharged to the ground voltage VSS.

Figure 17:
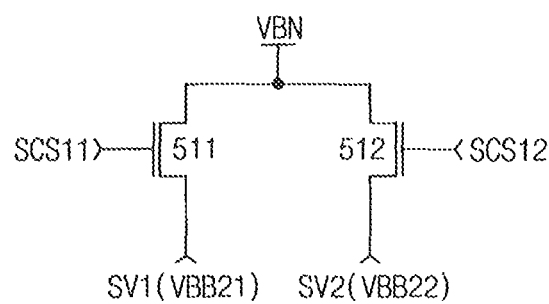
FIG. 17 illustrates a first power selection switch of FIG. 7 according to an exemplary embodiment of the present inventive concept.
Figure 18:
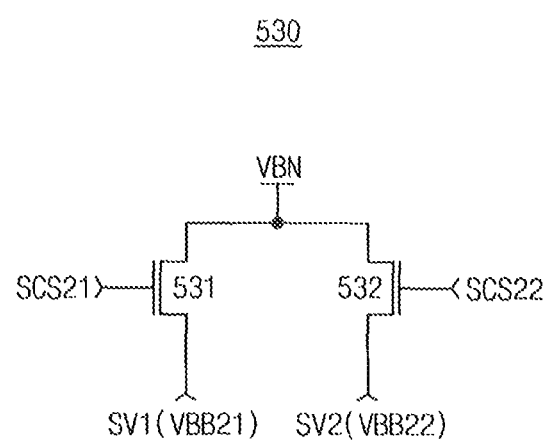
FIG. 18 illustrates a second power selection switch of FIG. 7 according to an exemplary embodiment of the present inventive concept.

The present inventive concept is not limited thereto, and the first selection voltage SV1 has a different voltage level, and the second selection voltage SV2 has a different voltage level. With reference to FIGS. 17 and 18, such different voltage levels will be described.

FIG. 17 illustrates a first power selection switches of FIG. 7 according to an exemplary embodiment of the present inventive concept.

FIG. 18 illustrates a second power selection switches of FIG. 7 according to an exemplary embodiment of the present inventive concept.

Referring to FIGS. 17 and 18, the first negative voltage VBB21 is provided as the first selection voltage SV1 to the first and second power selection switches 510 and 530, and the second negative voltage VBB22 is provided as the second selection voltage SV2 to the first and second power selection switches 510 and 530. The supply of the first and the second selection voltage SV1 and SV2 may be controlled according to the switching control signals SCS11, SCS12, SCS21 and SCS22 as described above with reference to FIG. 16.

Figure 19:
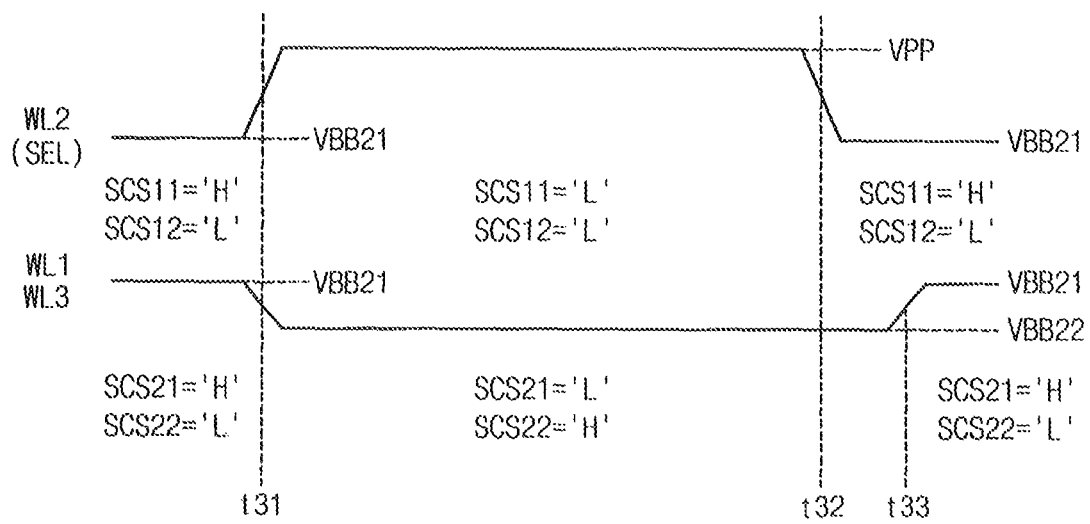
FIG. 19 illustrates a timing diagram for driving word-lines of a memory cell block of FIG. 13 according to an exemplary embodiment of the present inventive concept.

FIG. 19 illustrates a timing diagram for operating word-lines in the memory cell block of FIG. 13 according to an exemplary embodiment of the present inventive concept.

In FIG. 19, it is assumed that the word-line WL2 is selected.

Referring to FIGS. 7, 13 and 17 through 19, before timing t31, the switching control signal SCS11 is logic high level, the switching control signal SCS12 is logic low level, the switching control signal SCS21 is logic high level and the switching control signal SCS22 is logic low level. Therefore, the selected word-line WL2 and the adjacent word-lines WL1 and WL3 are precharged to the first negative voltage VBB21 level before timing t31.

During an activation interval between timings t31 and t32, the switching control signal SCS11 is logic low level, the switching control signal SCS12 is logic low level, the switching control signal SCS21 is logic low level and the switching control signal SCS22 is logic high level. Therefore, the selected word-line WL2 is charged with the boosted voltage VPP by the sub word-line driver 550 and an off-voltage level of the adjacent word-lines WL1 and WL3 is charged with the second negative voltage VBB22.

At timing t32, the selected word-line WL2 is deactivated, and discharged to the first negative voltage VBB21 level, and the off-voltage level of the adjacent word-lines WL1 and WL3 is maintained at the second negative voltage VBB22 level until timing t33. After timing t33, the switching control signal SCS11 is logic high level, the switching control signal SCS12 is logic low level, the switching control signal SCS21 is logic high level and the switching control signal SCS22 is logic low level. Therefore, the selected word-line WL2 and the adjacent word-lines WL1 and WL3 are charged with the first negative voltage VBB21.

Figure 20:
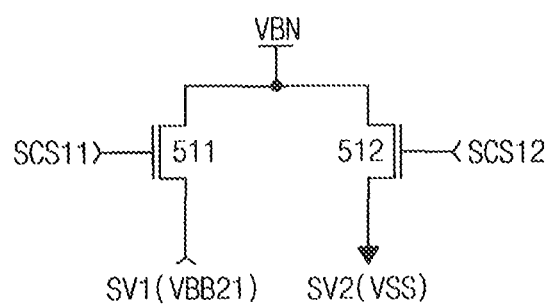
FIG. 20 illustrates a first power selection switch of FIG. 7 according to an exemplary embodiment of the present inventive concept.
Figure 21:
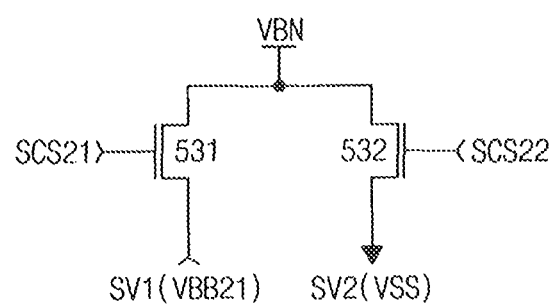
FIG. 21 illustrates a second power selection switch of FIG. 7 according to an exemplary embodiment of the present inventive concept.

The present inventive concept is not limited thereto, and the first selection voltage SV1 has a different voltage level, and the second selection voltage SV2 has a different voltage level. With reference to FIGS. 20 and 21, such different voltage levels will be described.

FIG. 20 illustrates a first power selection switch of FIG. 7 according to an exemplary embodiment of the present inventive concept.

FIG. 21 illustrates a second power selection switch of FIG. 7 according to an exemplary embodiment of the present inventive concept.

Referring to FIGS. 20 and 21, the first negative voltage VBB21 is provided as the first selection voltage SV1 to the first and second power selection switches 510 and 530 and the ground voltage VSS is provided as the second selection voltage SV2 to the first and second power selection switches 510 and 530. In addition, the first negative voltage VBB21 is provided as the first selection voltage SV1 to the first and second power selection switches 510 and 530 and the ground voltage VSS is provided as the second selection voltage SV2 to the third power selection switch 520 coupled to the sub word-line driver 560 that drives the word-line WL4 in FIG. 7. The switching signal generator 261 in FIG. 8 provides the switching control signals SCS31 and SCS32 to the third power selection switch 520.

Figure 22:
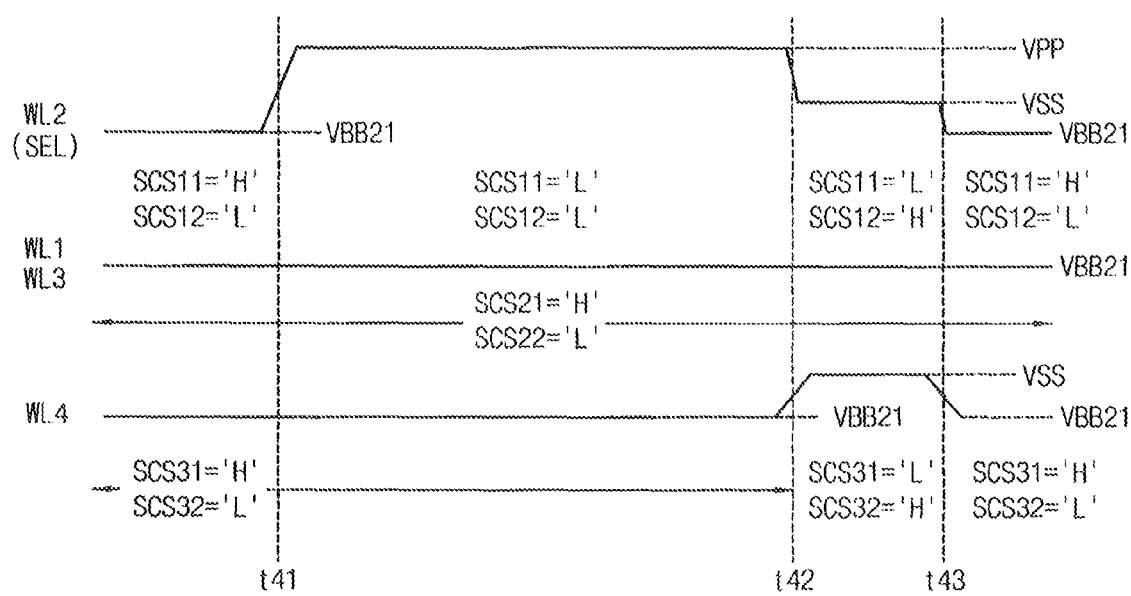
FIG. 22 illustrates a timing diagram for driving word-lines in a memory cell block of FIG. 13 according to an exemplary embodiment of the present inventive concept.

FIG. 22 illustrates a timing diagram for operating word-lines in the memory cell block of FIG. 13 according to an exemplary embodiment of the present inventive concept.

In FIG. 22, it is assumed that the word-line WL2 is selected.

Referring to FIGS. 7, 13 and 20 through 22, before timing t41, the switching control signal SCS11 is logic high level, the switching control signal SCS12 is logic low level, the switching control signal SCS21 is logic high level, the switching control signal SCS22 is logic low level, the switching control signal SCS31 is logic high level, and the switching control signal SCS32 is logic low level. Therefore, the selected word-line WL2, the adjacent word-lines WL1 and WL3 and the adjacent word-line WL4 are precharged to the first negative voltage VBB21 level before timing t41.

During an activation interval between timings t41 and t42, the switching control signal SCS11 is logic low level, the switching control signal SCS12 is logic low level, the switching control signal SCS21 is logic high level, the switching control signal SCS22 is logic low level, the switching control signal SCS31 is logic high level, and the switching control signal SCS32 is logic low level. Therefore, the selected word-line WL2 is activated, and the selected word-line WL2 is charged with the boosted voltage VPP by the sub word-line driver 550, the off-voltage level of the adjacent word-lines WL1 and WL3 is maintained at the first negative voltage VBB21 and the off-voltage level of the adjacent word-line WL4 is maintained at the first negative voltage VBB21.

During a first deactivation interval between timings t42 and t43, the switching control signal SCS11 is logic low level, the switching control signal SCS12 is logic high level, the switching control signal SCS21 is logic high level, the switching control signal SCS22 is logic low level, the switching control signal SCS31 is logic low level, and the switching control signal SCS32 is logic high level. Therefore, the selected word-line WL2 is discharged to the ground voltage VSS, the off-voltage level of the adjacent word-lines WL1 and WL3 is maintained at the first negative voltage VBB21 and the off-voltage level of the adjacent word-line WL4 is charged to the ground voltage VSS during the first deactivation interval.

During a second deactivation interval after timing t43, the switching control signal SCS11 is logic high level, the switching control signal SCS12 is logic low level, the switching control signal SCS21 is logic high level, the switching control signal SCS22 is logic low level, the switching control signal SCS31 is logic high level, and the switching control signal SCS32 is logic low level. Therefore, the selected word-line WL2 is discharged to the first negative voltage VBB21, the off-voltage level of the adjacent word-lines WL1 and WL3 is maintained at the first negative voltage VBB21 and the off-voltage level of the adjacent word-line WL4 is discharged to the first negative voltage VBB21 during the second deactivation interval.

The present inventive concept is not limited thereto, and the first selection voltage SV1 has a different voltage level, and the second selection voltage SV2 has a different voltage level. With reference to FIGS. 20 and 21, such different voltage levels will be described.

Figure 23:
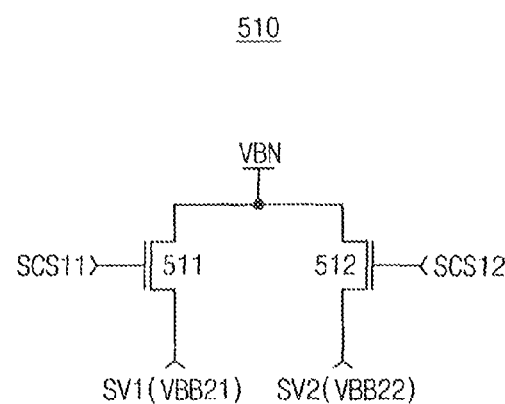
FIG. 23 illustrates a first power selection switch of FIG. 7 according to an exemplary embodiment of the present inventive concept.

FIG. 23 illustrates a first power selection switch of FIG. 7 according to an exemplary embodiment of the present inventive concept.

Figure 24:
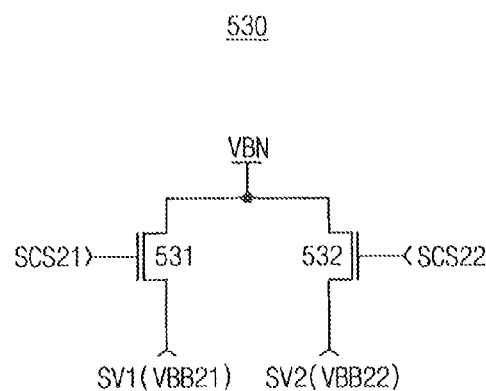
FIG. 24 illustrates a second power selection switch of FIG. 7 according to an exemplary embodiment of the present inventive concept.

FIG. 24 illustrates a second power selection switch of FIG. 7 according to an exemplary embodiment of the present inventive concept.

Referring to FIGS. 23 and 24, the first negative voltage VBB21 is provided as the first selection voltage SV1 to the first and second power selection switches 510 and 530 and the second negative voltage VBB22 is provided as the second selection voltage SV2 to the first and second power selection switches 510 and 530. In addition, the first negative voltage VBB21 is provided as the first selection voltage SV1 to the first and second power selection switches 510 and 530 and the second negative voltage VBB22 is provided as the second selection voltage SV2 to the third power selection switch 520 coupled to the sub word-line driver 560 that drives the word-line WL4 in FIG. 7. The switching signal generator 261 of FIG. 8 provides the switching control signals SCS31 and SCS32 to the third power selection switch 520.

Figure 25:
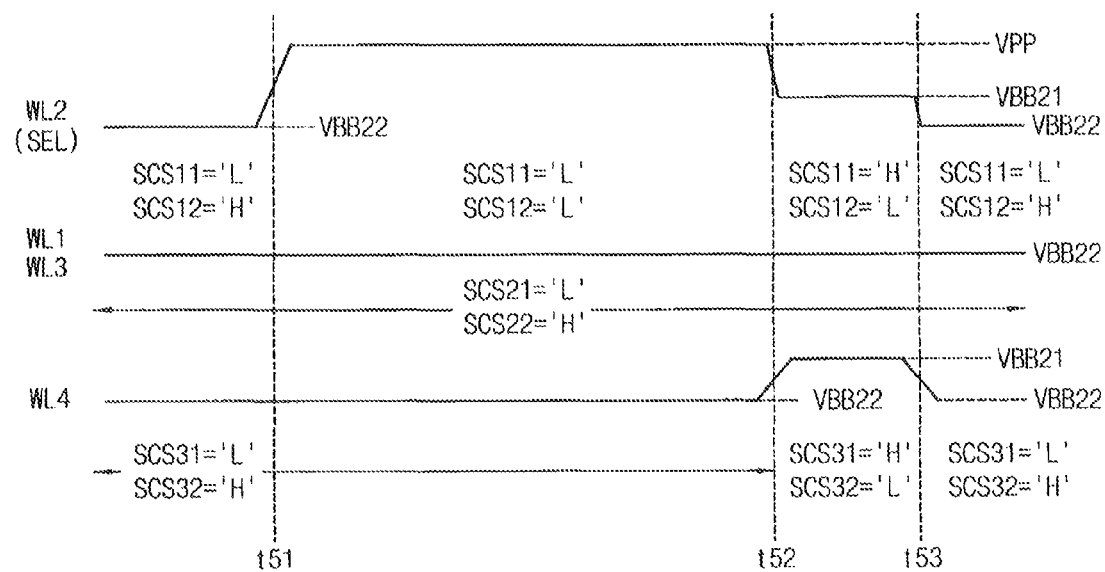
FIG. 25 illustrates a timing diagram for driving word-lines in a memory cell block of FIG. 13 according to an exemplary embodiment of the present inventive concept.

FIG. 25 illustrates a timing diagram for operating word-lines of a memory cell block of FIG. 13 according to an exemplary embodiment of the present inventive concept.

In FIG. 25, it is assumed that the word-line WL2 is selected.

Referring to FIGS. 7, 13 and 23 through 25, before timing t51, the switching control signal SCS11 is logic low level, the switching control signal SCS12 is logic high level, the switching control signal SCS21 is logic low level, the switching control signal SCS22 is logic high level, the switching control signal SCS31 is logic low level, and the switching control signal SCS32 is logic high level. Therefore, the selected word-line WL2, the adjacent word-lines WL1 and WL3 and the adjacent word-line WL4 are precharged to the second negative voltage VBB22 level before timing t51.

During an activation interval between timings t51 and t52, the switching control signal SCS11 is logic low level, the switching control signal SCS12 is logic low level, the switching control signal SCS21 is logic low level, the switching control signal SCS22 is logic high level, the switching control signal SCS31 is logic low level, and the switching control signal SCS32 is logic high level. Therefore, the selected word-line WL2 is charged with the boosted voltage VPP by the sub word-line driver 550, the off-voltage level of the adjacent word-lines WL1 and WL3 is maintained at the second negative voltage VBB22 and the off-voltage level of the adjacent word-line WL4 is maintained at the second negative voltage VBB22.

During a first deactivation interval between timings t52 and t53, the switching control signal SCS11 is logic high level, the switching control signal SCS12 is logic low level, the switching control signal SCS21 is logic low level, the switching control signal SCS22 is logic high level, the switching control signal SCS31 is logic high level, and the switching control signal SCS32 is logic low level. Therefore, the selected word-line WL2 is discharged to the first negative voltage VBB21, the off-voltage level of the adjacent word-lines WL1 and WL3 is maintained at the second negative voltage VBB22 and the off-voltage level of the adjacent word-line WL4 is charged with the first negative voltage VBB21 during the first deactivation interval.

During a second deactivation interval after timing t53, the switching control signal SCS11 is logic low level, the switching control signal SCS12 is logic high level, the switching control signal SCS21 is logic low level, the switching control signal SCS22 is high level, the switching control signal SCS31 is logic low level, and the switching control signal SCS32 is logic high level. Therefore, the selected word-line WL2 is discharged to the second negative voltage VBB22, the off-voltage level of the adjacent word-lines WL1 and WL3 is maintained at the second negative voltage VBB22 and the off-voltage level of the adjacent word-line WL4 is discharged to the second negative voltage VBB22 during the second deactivation interval.

In FIGS. 14 through 25, for the convenience of description, word-line WL2, one of even-numbered word lines, is selected. The same description may be applicable when one of odd-numbered word-lines WL1 or WL3 is selected.

As described with reference to FIGS. 3 through 25, deactivation voltage level of a selected word-line and off-voltage level of at least one adjacent word-line adjacent to the selected word-line are individually controlled, and thus the disturbance between a selected word line and unselected word line adjacent to the selected word line may be minimized.

Figure 26:
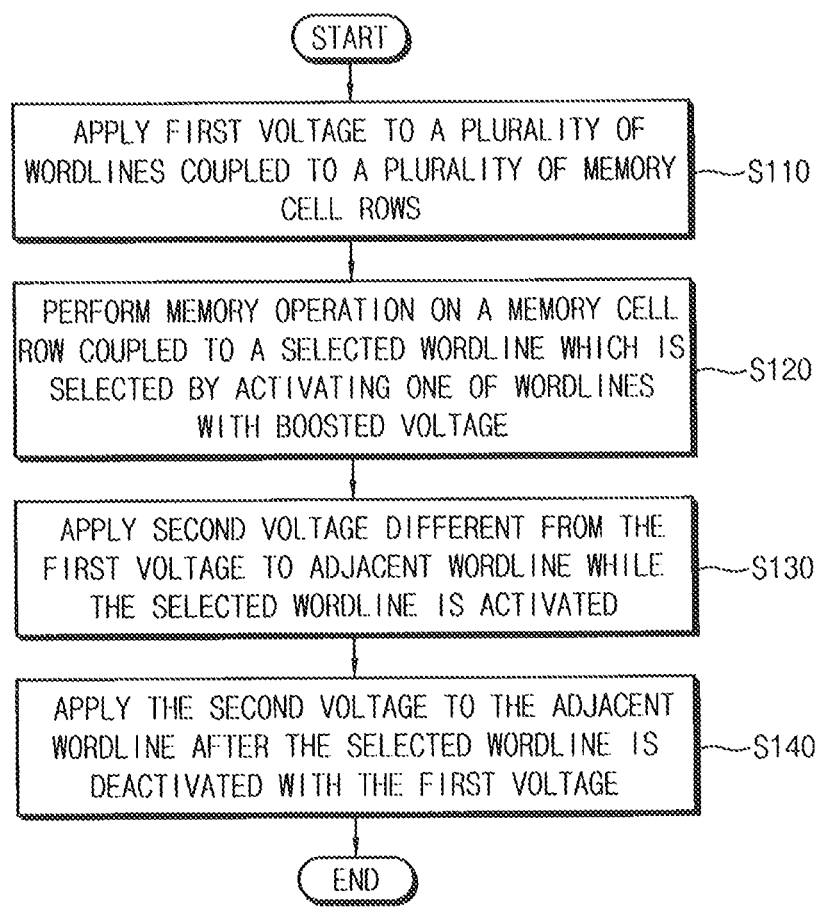
FIG. 26 is a flow chart illustrating a method of operating a semiconductor memory device according to an exemplary embodiment of the present inventive concept.

FIG. 26 is a flow chart illustrating a method of operating a semiconductor memory device according to an exemplary embodiment of the present inventive concept.

Hereinafter, there will be description on a method of operating a semiconductor memory device with reference to FIGS. 3 through 26.

Referring to FIGS. 3 through 26, a plurality of word-lines WL1~WL4 is precharged by applying a first voltage (for example, a ground voltage VSS) to the word-lines WL1~WL4 coupled to a plurality of memory cell rows (S110). A memory operation (for example, a write operation or a read operation) is performed on a memory cell row coupled to a selected word-line WL2 by activating the word-line WL2 with a boosted voltage VPP (S210). While the selected word-line WL2 is activated, a second voltage (for example, a first negative voltage VBB21) different from the first voltage is applied to word-lines WL1 and WL3 adjacent to the selected word-line WL2 (S130). The first voltage VSS is applied to the adjacent word-lines WL1 and WL3 after the selected word-line WL2 is deactivated. For example, the word lines WL1 and WL3 are charged from the second voltage VBB21 to the first voltage VSS (S140).

Therefore, according to a method of operating a semiconductor memory device, the deactivation voltage level of the selected word-line and the off-voltage level of at least one adjacent word-line adjacent to the selected word-line are individually controlled, and thus, the disturbance between a selected word line and unselected word lines adjacent to the selected word line may be minimized.

Figure 27:
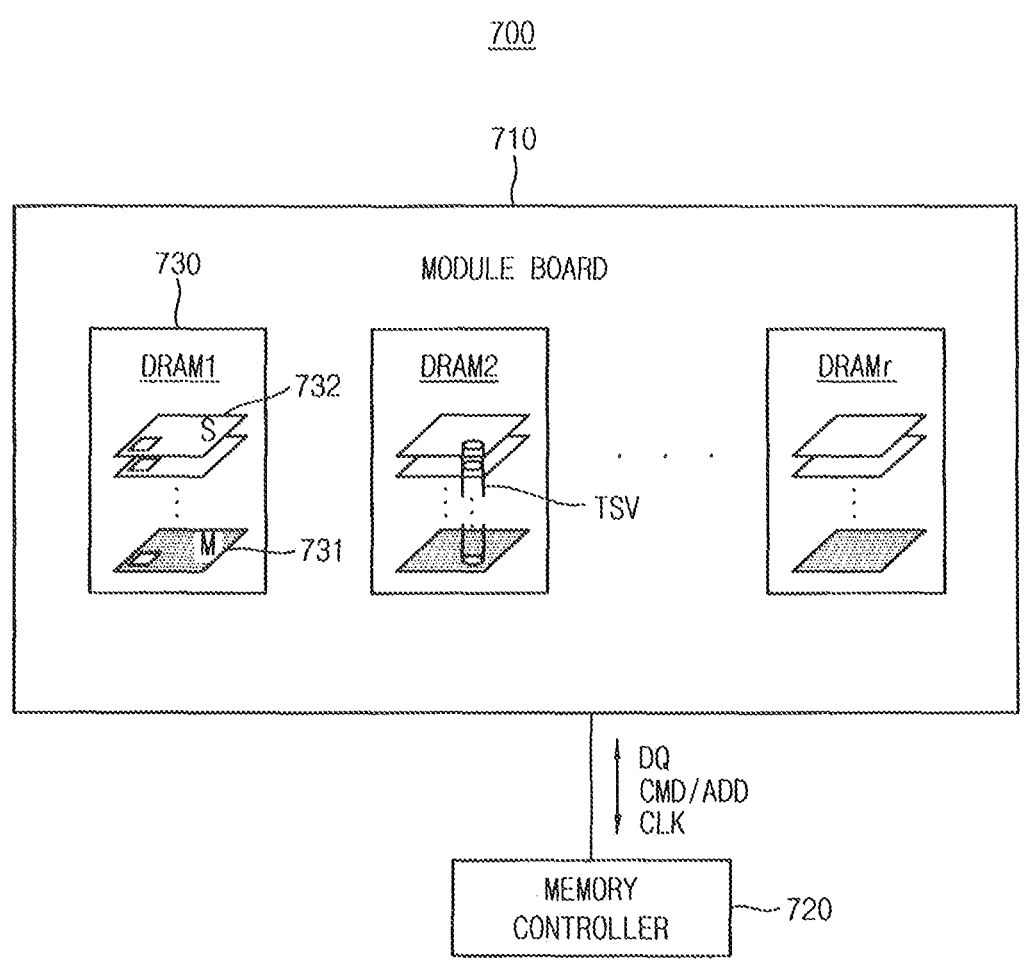
FIG. 27 illustrates a memory system including a semiconductor memory device according to an exemplary embodiment of the present inventive concept.

FIG. 27 illustrates a memory system including a semiconductor memory device according to an exemplary embodiment of the present inventive concept.

Referring to FIG. 27, a memory system 700 includes a memory module 710 and a memory controller 720. The memory module 710 includes at least one semiconductor memory device 730 mounted on a module board. The semiconductor memory device 730 may employ the semiconductor memory device 200a of FIG. 3. For example, the semiconductor memory device 730 may be constructed as a DRAM chip. In addition, the semiconductor memory device 730 includes a stack of semiconductor chips. In this case, the semiconductor chips includes at least one master chip 731 and at least one slave chip 732. Signal transfer between the semiconductor chips may occur via through-silicon vias TSV.

The master chip 731 and the slave chip 732 may employ the semiconductor memory device 200a of FIG. 3. Therefore, each of the master chip 731 and the slave chip 732 includes a plurality of sub word-line drivers coupled to odd word-lines and even word-lines respectively and a plurality of power switches coupled to the sub word-line drivers respectively as described with reference to FIGS. 3 through 25. Therefore, deactivation voltage level of a selected word-line and off-voltage level of at least one adjacent word-line adjacent to the selected word-line are individually controlled, and thus, influence of the disturbance may be minimized.

In addition, a three dimensional (3D) memory array is provided in semiconductor memory device 730. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array. The following patent documents, which are hereby incorporated by reference, describe configurations for the 3D memory arrays, in which the three-dimensional memory array is configured as a plurality of levels, with word-lines and/or bit-lines shared between levels: U.S. Pat. Nos. 7,679,133; 8,553,466; 8,654,587; 8,559,235; and US Pat. Pub. No. 2011/0233648.

The memory module 710 communicates with the memory controller 720 via a system bus. Data DQ, a command/address CMD/ADD, and a clock signal CLK may be transmitted and received between the memory module 710 and the memory controller 720 via the system bus.

Figure 28:
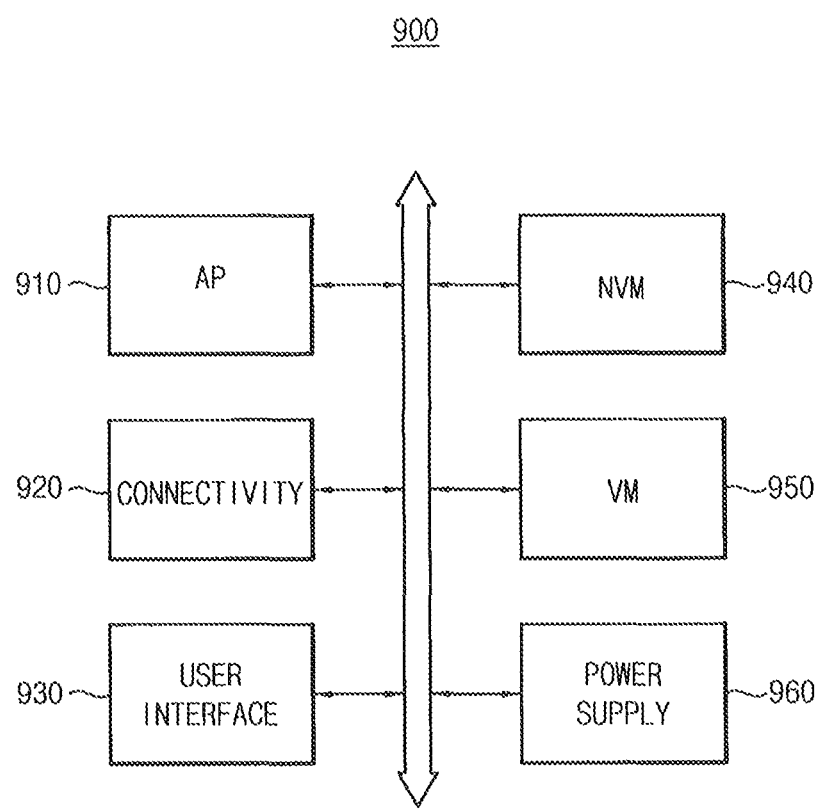
FIG. 28 is a block diagram illustrating a mobile device including a semiconductor memory device according to an exemplary embodiment of the present inventive concept.

FIG. 28 is a block diagram illustrating a mobile device including a semiconductor memory device according to an exemplary embodiment of the present inventive concept.

Referring to FIG. 28, a mobile device 900 includes an application processor 910, a connectivity unit 920, a semiconductor memory device 950, a nonvolatile memory device 940, a user interface 930 and a power supply 960. In some embodiments, the mobile device 900 may be a mobile phone, a smart phone, a personal digital assistant (PDA), a portable multimedia player (PMP), a digital camera, a music player, a portable game console, a navigation system, etc.

The application processor 910 may execute applications, such as a web browser, a game application, a video player, etc. In some embodiments, the application processor 910 includes a single core or multiple cores. For example, the application processor 910 may be a multi-core processor, such as a dual-core processor, a quad-core processor, a hexa-core processor, etc. The application processor 910 includes an internal or external cache memory.

The connectivity unit 920 may perform wired or wireless communication with an external device. For example, the connectivity unit 920 may perform Ethernet communication, near field communication (NFC), radio frequency identification (RFID) communication, mobile telecommunication, memory card communication, universal serial bus (USB) communication, etc. In some embodiments, the connectivity unit 920 includes a baseband chipset that supports communications, such as global system for mobile communications (GSM), general packet radio service (GPRS), wideband code division multiple access (WCDMA), high speed downlink/uplink packet access (HSxPA), etc.

The semiconductor memory device 950 may store data processed by the application processor 910 or operate as a working memory. The semiconductor memory device 950 may be a dynamic random access memory (DRAM), such as a double data rate synchronous dynamic random access memory (DDR SDRAM), a low power double data rate synchronous dynamic random access memory (LPDDR SDRAM), a graphics double data rate synchronous dynamic random access memory (GDDR SDRAM), a Rambus dynamic random access memory (RDRAM), etc. The semiconductor memory device 950 may employ the semiconductor memory device 200a of FIG. 3. Therefore, the semiconductor memory device 950 includes a plurality of sub word-line drivers coupled to odd word-lines and even word-lines respectively and a plurality of power switches coupled to the sub word-line drivers respectively as described with reference to FIGS. 3 through 25. Therefore, deactivation voltage level of a selected word-line and off-voltage level of at least one adjacent word-line adjacent to the selected word-line are individually controlled, and thus, influence of the disturbance may be minimized in the semiconductor memory device 950.

The nonvolatile memory device 940 may store a boot image for booting the mobile device 900. For example, the nonvolatile memory device 940 may be an electrically erasable programmable read-only memory (EEPROM), a flash memory, a phase change random access memory (PRAM), a resistance random access memory (RRAM), a nano floating gate memory (NFGM), a polymer random access memory (PoRAM), a magnetic random access memory (MRAM), a ferroelectric random access memory (FRAM), etc.

The user interface 930 includes at least one input device, such as a keypad, a touch screen, etc., and at least one output device, such as a speaker, a display device, etc. The power supply 960 may supply a power supply voltage to the mobile device 900. In some embodiments, the mobile device 900 may further include a camera image processor (CIS), and/or a storage device, such as a memory card, a solid state drive (SSD), a hard disk drive (HDD), a CD-ROM, etc.

The mobile device 900 and/or components of the mobile device 900 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

Figure 29:
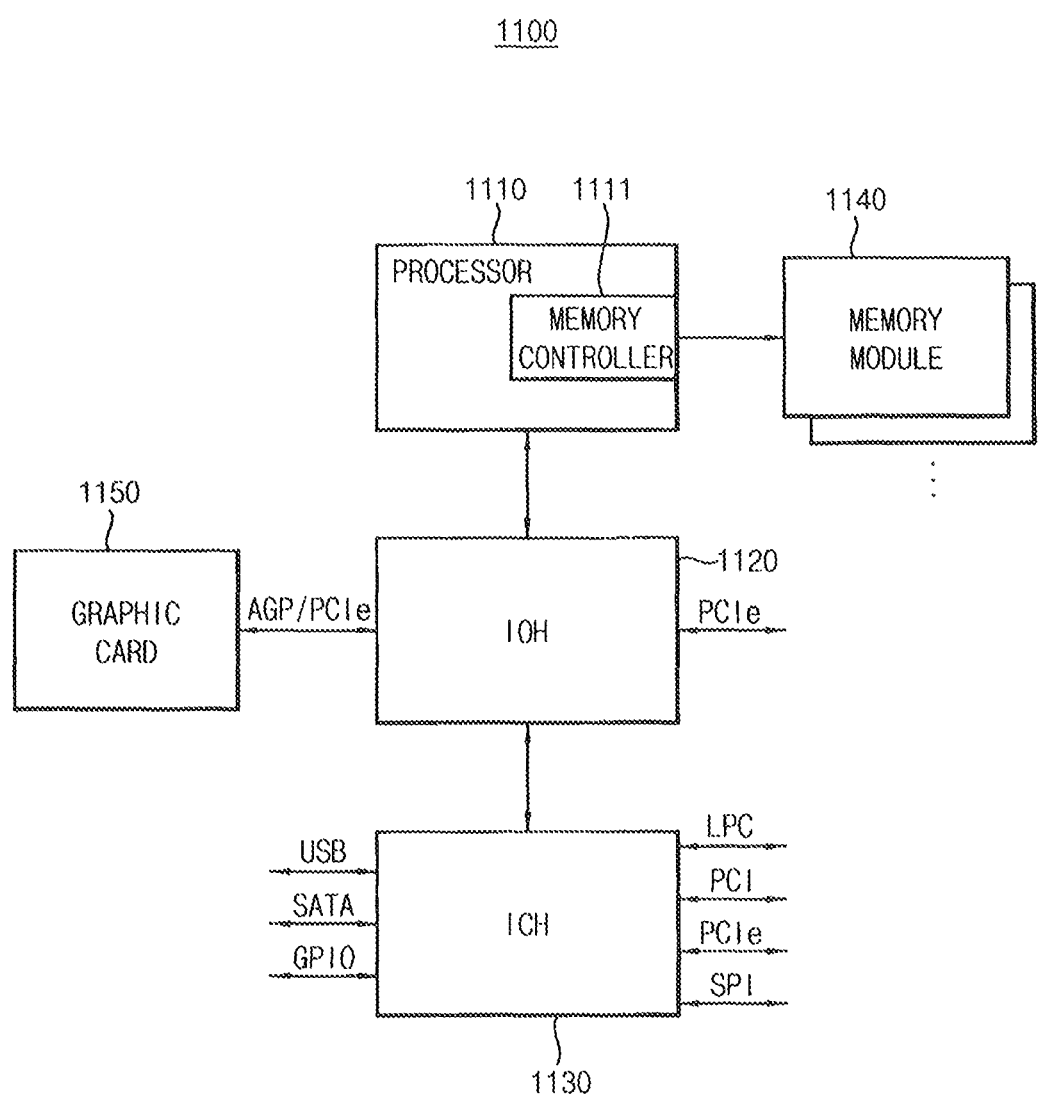
FIG. 29 is a block diagram illustrating a computing system including a semiconductor memory device according to an exemplary embodiment of the present inventive concept.

FIG. 29 is a block diagram illustrating a computing system including a semiconductor memory device according to an exemplary embodiment of the present inventive concept.

Referring to FIG. 29, a computing system 1100 includes a processor 1110, an input/output hub (IOH) 1120, an input/output controller hub (ICH) 1130, at least one memory module 1140 and a graphics card 1150. In some embodiments, the computing system 1100 may be a personal computer (PC), a server computer, a workstation, a laptop computer, a mobile phone, a smart phone, a personal digital assistant (PDA), a portable multimedia player (PMP), a digital camera, a digital television, a set-top box, a music player, a portable game console, a navigation system, etc.

The processor 1110 may perform various computing functions, such as executing specific software for performing specific calculations or tasks. For example, the processor 1110 may be a microprocessor, a central process unit (CPU), a digital signal processor, or the like. In some embodiments, the processor 1110 includes a single core or multiple cores. For example, the processor 1110 may be a multi-core processor, such as a dual-core processor, a quad-core processor, a hexa-core processor, etc. Although FIG. 21 illustrates the computing system 1100 including one processor 1110, in some embodiments, the computing system 1100 includes a plurality of processors. The processor 1110 includes an internal or external cache memory.

The processor 1110 includes a memory controller 1111 for controlling operations of the memory module 1140. The memory controller 1111 included in the processor 1110 may be referred to as an integrated memory controller (IMC). A memory interface between the memory controller 1111 and the memory module 1140 may be implemented with a single channel including a plurality of signal lines, or may be implemented with multiple channels, to each of which at least one memory module 1140 may be coupled. In some embodiments, the memory controller 1111 may be located inside the input/output hub 1120, which may be referred to as a memory controller hub (MCH).

The memory module 1140 includes a plurality of semiconductor memory devices that store data provided from the memory controller 1111. Each of the plurality of semiconductor memory devices may employ the semiconductor memory device 200a of FIG. 3. Therefore, each of the plurality of semiconductor memory devices includes a plurality of sub word-line drivers coupled to odd word-lines and even word-lines respectively and a plurality of power switches coupled to the sub word-line drivers respectively as described with reference to FIGS. 3 through 25. Therefore, deactivation voltage level of a selected word-line and off-voltage level of at least one adjacent word-line adjacent to the selected word-line are individually controlled, and thus, influence of the disturbance may be minimized in each semiconductor memory device.

The input/output hub 1120 manages data transfer between the processor 1110 and devices, such as the graphics card 1150. The input/output hub 1120 may be coupled to the processor 1110 via various interfaces. For example, the interface between the processor 1110 and the input/output hub 1120 may be a front side bus (FSB), a system bus, a Hyper-Transport, a lightning data transport (LDT), a QuickPath interconnect (QPI), a common system interface (CSI), etc. Although FIG. 21 illustrates the computing system 1100 including one input/output hub 1120, the computing system 1100 may include a plurality of input/output hubs. The input/output hub 1120 may provide various interfaces with the devices. For example, the input/output hub 1120 may provide an accelerated graphics port (AGP) interface, a peripheral component interface-express (PCIe), a communications streaming architecture (CSA) interface, etc.

The graphics card 1150 may be coupled to the input/output hub 1120 via AGP or PCIe. The graphics card 1150 controls a display device (not shown) for displaying an image. The graphics card 1150 includes an internal processor for processing image data and an internal semiconductor memory device. In some embodiments, the input/output hub 1120 includes an internal graphics device along with or instead of the graphics card 1150 outside the input/output hub 1120. The graphics device included in the input/output hub 1120 may be referred to as integrated graphics. Further, the input/output hub 1120 including the internal memory controller and the internal graphics device may be referred to as a graphics and memory controller hub (GMCH).

The input/output controller hub 1130 may perform data buffering and interface arbitration in order to efficiently operate various system interfaces. The input/output controller hub 1130 may be coupled to the input/output hub 1120 via an internal bus, such as a direct media interface (DMI), a hub interface, an enterprise Southbridge interface (ESI), PCIe, etc. The input/output controller hub 1130 may provide various interfaces with peripheral devices. For example, the input/output controller hub 1130 may provide a universal serial bus (USB) port, a serial advanced technology attachment (SATA) port, a general purpose input/output (GPIO), a low pin count (LPC) bus, a serial peripheral interface (SPI), PCI, PCIe, etc.

The processor 1110, the input/output hub 1120 and the input/output controller hub 1130 may be implemented as separate chipsets or separate integrated circuits. In other embodiments, at least two of the processor 1110, the input/output hub 1120 and the input/output controller hub 1130 may be implemented as a single chipset.

The present disclosure may be applied to systems using semiconductor memory devices. The present disclosure may be applied to systems such as be a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, etc.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A semiconductor memory device comprising:
    a memory cell array including a plurality of memory cell rows coupled to a plurality of word-lines;
    a plurality of sub word-line drivers coupled to the plurality of word-lines; and
    a plurality of power selection switches coupled to the plurality of sub word-line drivers, wherein each power selection switch is configured to control a deactivation voltage level of a first word-line activated from the plurality of word-lines and an off-voltage level of a second word-line adjacent to the first word-line so that the deactivation voltage level and the off-voltage level have at least one of a ground voltage, a first negative voltage and a second negative voltage,
    wherein the off-voltage level of the second word-line after deactivation of the first word-line is controlled to have different voltage level from the off-voltage level of the second word-line during an activation interval in which the first word-line is activated,
    wherein the ground voltage, the first negative voltage and the second negative voltage have different voltage levels from each other.

2. The semiconductor memory device of claim 1, wherein each power selection switch includes a first power selection switch coupled to a first sub word-line driver of the sub word-line drivers that drives the first word-line and a second power selection switch coupled to a second sub word-line driver of the sub word-line drivers that drives the second word-line.

3. The semiconductor memory device of claim 2, wherein the second power selection switch provides the second sub word-line driver with the first negative voltage which is lower than the ground voltage during the activation interval in which the first sub word-line driver provides the first word-line with a boosted voltage so that the first word-line is activated.

4. The semiconductor memory device of claim 3, wherein the first sub word-line driver, upon completion of the activation interval, discharges the first word-line from a level of the boosted voltage to the ground voltage and the second sub word-line driver, after the completion of the activation interval, charges the second word-line from the first negative voltage to the ground voltage.

5. The semiconductor memory device of claim 2, wherein the second power selection switch provides the second sub word-line driver with the second negative voltage whose level which is lower than the first negative voltage during the activation interval in which the first sub word-line driver provides the first word-line with a boosted voltage so that the first word-line is activated.

6. The semiconductor memory device of claim 5, wherein the first sub word-line driver, upon completion of the activation interval, discharges the first word-line from a level of the boosted voltage to the first negative voltage,
    the second sub word-line driver, after the completion of the activation interval, charges the second word-line from the second negative voltage to the first negative voltage, and
    the first negative voltage is higher than the second negative voltage.

7. The semiconductor memory device of claim 2, wherein each power selection switch further includes a third power selection switch configured to control an off-voltage of a third word-line adjacent to the second word-line,
    wherein the third power selection switch is coupled to a third sub word-line driver that drives the third word-line.

8. The semiconductor memory device of claim 7, wherein the second power selection switch and the third power selection switch provide the second sub word-line driver and the third sub word-line driver with the first negative voltage which is lower than the ground voltage, respectively, during the activation interval in which the first sub word-line driver provides the first word-line with a boosted voltage so that the first word-line is activated.

9. The semiconductor memory device of claim 8, wherein the first sub word-line driver discharges, upon completion of the activation interval, the first word-line from a level of the boosted voltage to the ground voltage during a first deactivation interval and discharges, upon completion of the first deactivation interval, the first word-line from the ground voltage to the first negative voltage during a second deactivation interval which is successive to the first deactivation interval, and
    wherein the third sub word line driver charges, during the first deactivation interval, the third word line from the first negative voltage to the ground voltage, and discharges, during the second deactivation interval, the third word line from the ground voltage to the first negative voltage.

10. The semiconductor memory device of claim 7, wherein the second power selection switch provides the second sub word-line driver with the second negative voltage which is lower than the ground voltage and the third power selection switch provides the third sub word-line driver with the second negative voltage during the activation interval in which the first sub word-line driver provides the first word-line with a boosted voltage so that the first word-line is activated,
    wherein the first sub word-line driver, upon completion of the activation interval, discharges the first word-line from a level of the boosted voltage to the first negative voltage during a first deactivation interval and upon completion of the first deactivation interval, discharges the first word-line from the first negative voltage to the second negative voltage during a second deactivation interval successive to the first deactivation interval, and
    wherein the third power selection switch provides the third sub word-line driver with the first negative voltage during the first deactivation interval and the second negative voltage during the second deactivation interval.

11. The semiconductor memory device of claim 1, wherein the off-voltage level of the second word-line after deactivation of the first word-line is higher than the off-voltage level of the second word-line during the activation interval.

12. The semiconductor memory device of claim 1, further comprising a switching signal generator configured to generate switching control signals based on a row address to select the first word-line,
   wherein the switching signal generator is included in a row decoder that decodes the row address to select one of the plurality of word lines, and
   wherein the first power selection switch and the second power selection switch are included in the row decoder.

13. The semiconductor memory device of claim 1, further comprising:
   a plurality of bit line pairs coupled to the plurality of memory cell rows;
   a plurality of bit line sense amplifiers coupled to the bit line pairs;
   wherein each power selection switch is disposed in a conjunction region disposed between a first region where part of the plurality of sub word-line drivers is disposed and a second region where part of the plurality of bit line sense amplifiers is disposed,
   wherein the semiconductor memory device further comprises a selection circuit configured to provide the power selection switch with two voltages from the ground voltage, the first negative voltage and the second negative voltage as a first selection voltage and a second selection voltage, in response to a plurality of selection signals.

14. The memory system of claim 1, wherein the first power selection switch includes:
   a first n-channel metal oxide semiconductor (NMOS) transistor that provides the first selection voltage to a negative voltage terminal coupled to the plurality of sub word-line drivers, in response to a first switching control signal; and
   a second NMOS transistor that provides the second selection voltage to the negative voltage terminal.

15. A memory system comprising:
   a semiconductor memory device; and
   a memory controller to control the semiconductor memory device, wherein the semiconductor memory device comprises:
   a memory cell array including a plurality of memory cell rows coupled to a plurality of word-lines;
   a plurality of sub word-line drivers coupled to the plurality of word-lines; and
   a plurality of power selection switches coupled to the plurality of sub word-line drivers, wherein each power selection switch is configured to control a deactivation voltage level of a first word-line activated from the plurality of word-lines and an off-voltage level of a second word-line adjacent to the first word-line so that the deactivation voltage level and the off-voltage level have at least one of a ground voltage, a first negative voltage and a second negative voltage,
   wherein the ground voltage, the first negative voltage and the second negative voltage have different voltage levels from each other,
   wherein the off-voltage level of the second word-line after deactivation of the first word-line is controlled to have different voltage level from the off-voltage level of the second word-line during an activation interval in which the first word-line is activated.

16. A method of operating a semiconductor memory device, comprising:
   driving a first word line at a first voltage level during an activation period of the first word line;
   driving, during the activation period, a second word line and a third word line at a second voltage level which is higher than the first voltage level, wherein the second word line is adjacent to the first word line, and the third word line, adjacent to the second word line, is spaced apart from the first word line;
   performing, upon completion of the activation period, a first deactivation operation on the first word line during a first deactivation period of the first word line, wherein the first word line is driven from the first voltage level to a third voltage level which is between the first voltage level and the second voltage level; and
   performing, upon completion of the first deactivation period, a second deactivation operation on the first word line, wherein the first word line is driven from the third voltage level to the second voltage level.

17. The method of claim 16, wherein the first voltage level is a boosted voltage, the second voltage level is a first negative voltage, and the third voltage level is a ground voltage, and wherein the boosted voltage is higher than the ground voltage, and the first negative voltage is lower than the ground voltage.

18. The method of claim 16, wherein the first voltage level is a boosted voltage, the second voltage level is a second negative voltage, and the third voltage level is a third negative voltage, and wherein the boosted voltage is higher than the third negative voltage, and the third negative voltage is higher than the second negative voltage.

19. The method of claim 16, wherein during the first and the second deactivation periods, the second word line is driven to the second voltage level.

20. The method of claim 16, wherein during the first deactivation period, the third word line is driven from the second voltage to the third voltage, and wherein during the second deactivation period, the third word line is driven from the third voltage to the second voltage.

* * * * *